(12) United States Patent
Kato et al.

(10) Patent No.: US 8,604,476 B2
(45) Date of Patent: Dec. 10, 2013

(54) SEMICONDUCTOR DEVICE INCLUDING MEMORY CELL

(75) Inventors: Kiyoshi Kato, Atsugi (JP); Yutaka Shionoiri, Isehara (JP); Shuhei Nagatsuka, Atsugi (JP); Yuto Yakubo, Isehara (JP); Jun Koyama, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 36 days.

(21) Appl. No.: 13/270,455

(22) Filed: Oct. 11, 2011

(65) Prior Publication Data

US 2012/0112191 A1    May 10, 2012

(30) Foreign Application Priority Data

Nov. 5, 2010    (JP) ................. 2010-247995
Nov. 5, 2010    (JP) ................. 2010-247996

(51) Int. Cl.
    *H01L 29/04*       (2006.01)
(52) U.S. Cl.
    USPC .................. 257/57; 257/E29.083
(58) Field of Classification Search
    USPC ........................ 257/57, E29.083
    See application file for complete search history.

(56) References Cited

U.S. PATENT DOCUMENTS

| | | |
|---|---|---|
| 4,466,081 A | 8/1984 | Masuoka |
| 5,220,530 A | 6/1993 | Itoh |
| 5,349,366 A | 9/1994 | Yamazaki et al. |
| 5,428,238 A | 6/1995 | Hayashi et al. |
| 5,506,436 A | 4/1996 | Hayashi et al. |
| 5,576,571 A | 11/1996 | Hayashi et al. |
| 5,578,852 A | 11/1996 | Hayashi et al. |
| 5,578,853 A | 11/1996 | Hayashi et al. |
| 5,581,106 A | 12/1996 | Hayashi et al. |
| 5,731,856 A | 3/1998 | Kim et al. |
| 5,744,864 A | 4/1998 | Cillessen et al. |
| 6,127,702 A | 10/2000 | Yamazaki et al. |

(Continued)

FOREIGN PATENT DOCUMENTS

| | | |
|---|---|---|
| EP | 0601590 A | 6/1994 |
| EP | 0971360 A | 1/2000 |

(Continued)

OTHER PUBLICATIONS

Fortunato.E et al., "Wide-Bandgap High-Mobility ZNO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Kimberly Rizkallah
*Assistant Examiner* — Duy T Nguyen
(74) *Attorney, Agent, or Firm* — Eric J. Robinson; Robinson Intellectual Property Law Office, P.C.

(57) ABSTRACT

A data retention period in a semiconductor device or a semiconductor memory device is lengthened. The semiconductor device or the semiconductor memory includes a memory circuit including a first transistor including a first semiconductor layer and a first gate and a second transistor including a second semiconductor layer, a second gate, and a third gate The first semiconductor layer is formed at the same time as a layer including the second gate.

21 Claims, 16 Drawing Sheets

(56) References Cited

U.S. PATENT DOCUMENTS

| | | | |
|---|---|---|---|
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,714,633 B2 | 5/2010 | Kato | |
| 7,732,819 B2 | 6/2010 | Akimoto et al. | |
| 2001/0004273 A1* | 6/2001 | Sugimoto et al. | 349/43 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2002/0139980 A1* | 10/2002 | Yamazaki | 257/72 |
| 2003/0189401 A1 | 10/2003 | Kido et al. | |
| 2003/0209739 A1 | 11/2003 | Hisamoto et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2004/0240305 A1 | 12/2004 | Kato | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0147165 A1 | 6/2007 | Kato | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1* | 11/2007 | Ito et al. | 349/106 |
| 2007/0272759 A1 | 11/2007 | Kato | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0023696 A1* | 1/2008 | Yukawa et al. | 257/40 |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0002590 A1 | 1/2009 | Kimura | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0032668 A1 | 2/2010 | Yamazaki et al. | |
| 2010/0065844 A1 | 3/2010 | Tokunaga | |
| 2010/0092800 A1 | 4/2010 | Itagaki et al. | |
| 2010/0097838 A1 | 4/2010 | Tanaka et al. | |
| 2010/0109002 A1 | 5/2010 | Itagaki et al. | |
| 2010/0148171 A1 | 6/2010 | Hayashi et al. | |
| 2010/0148845 A1 | 6/2010 | Kato | |
| 2010/0193785 A1 | 8/2010 | Kimura | |
| 2011/0156025 A1 | 6/2011 | Shionoiri et al. | |

FOREIGN PATENT DOCUMENTS

| | | |
|---|---|---|
| EP | 1737044 A | 12/2006 |
| EP | 2226847 A | 9/2010 |
| JP | 57-105889 | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07-099251 A | 4/1995 |
| JP | 08-264794 A | 10/1996 |
| JP | 10-084047 A | 3/1998 |
| JP | 11-505377 | 5/1999 |
| JP | 2000-044236 A | 2/2000 |
| JP | 2000-150900 A | 5/2000 |
| JP | 2001-028443 A | 1/2001 |
| JP | 2001-053167 A | 2/2001 |
| JP | 2001-230329 A | 8/2001 |
| JP | 2002-076356 A | 3/2002 |
| JP | 2002-093924 A | 3/2002 |
| JP | 2002-289859 A | 10/2002 |
| JP | 2002-368226 A | 12/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165532 A | 6/2006 |
| JP | 4246400 | 4/2009 |
| JP | 2010-062547 A | 3/2010 |
| KR | 2010-0019357 A | 2/2010 |
| WO | WO-00/70683 | 11/2000 |
| WO | WO-2004/114391 | 12/2004 |
| WO | WO-2009/110623 | 9/2009 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

(56) References Cited

OTHER PUBLICATIONS

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)_m$ (m = 3, 4, and 5), $InGaO_3(ZnO)_3$, and $Ga_2O_3(ZnO)_m$ (m = 7, 8, 9, and 16) in the $In_2O_3$—$ZnGa_2O_4$—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)_m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H at al., "White Stacked Electrophosphorecent Organic Light-Emitting Devices Employing $MOO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTS,", IDW '09 : Proceedings of the 16th International Display Workshops, 2009, pp. 689-692.

Park.J et al., "Amorphous Indium—Gallium—Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZNO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZNO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest : SID International Symposium Digest of Technical Papers, May 31, 2009, pp. 1110-1112.

Ohara.H et al., "21.3:4.0 IN. QVGA AMOLED Display Using In—Ga—Zn—Oxide TFTS With a Novel Passivation Layer,", SID Digest '09 : SID International Symposium Digest of Technical Papers, May 31, 2009, pp. 284-287.

(56) References Cited

OTHER PUBLICATIONS

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 1, 2002, vol. 1, pp. 64-68.

Kimizuka.N et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,or Zn] at Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee at al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-17072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800- 803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

Ishii.T et al., "A Poly-Silicon TFT With a Sub-5-nm Thick Channel for Low-Power Gain Cell Memory in Mobile Applications,", IEEE Transactions on Electron Devices, Nov. 1, 2004, vol. 51, No. 11, pp. 1805-1810.

Kim.W et al., "An Experimental High-Density DRAM Cell with a Built-in Gain Stage,", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs ,", IEDM 92: Technical Digest of International Electron Devices Meeting, Dec. 13, 1992, pp. 1006-1008.

Shukuri.S et al., "A Semi-Static Complementary Gain Cell Technology for Sub-1 V Supply DRAM's,", IEEE Transactions on Electron Devices, Jun. 1, 1994, vol. 41, No. 6, pp. 926-931.

International Search Report (Application No. PCT/JP2011/073756) Dated Jan. 10, 2012.

Written Opinion (Application No. PCT/JP2011/073756) Dated Jan. 10, 2012.

* cited by examiner

SEMICONDUCTOR DEVICE INCLUDING MEMORY CELL

This application is based on Japanese Patent Application No. 2010-247996 and Japanese Patent Application No. 2010-247995 filed in the Japanese Patent Office on Nov. 5, 2010.

TECHNICAL FIELD

One embodiment of the present invention relates to semiconductor devices and semiconductor memory devices.

BACKGROUND ART

In recent years, semiconductor devices each including a memory circuit in which data can be written and erased and the data can be retained for a certain period without supply of power have been developed.

As the semiconductor device, for example, there is a semiconductor device including a memory circuit provided with a transistor (also referred to as a memory transistor) that is a memory element (for example, see Reference 1).

In a semiconductor device disclosed in Reference 1, a memory transistor includes a control gate electrode, a channel formation layer, and a floating gate electrode provided between the control gate electrode and the channel formation layer. By accumulation of electrical charge to be data in the floating gate electrode, data is written to the memory transistor.

REFERENCE

Reference 1: Japanese Published Patent Application No. 57-105889

DISCLOSURE OF INVENTION

A conventional semiconductor device as disclosed in Reference 1 has a problem in that data is lost by leakage of electrical charge after the data is written to a memory transistor. In a semiconductor device capable of storing data, a data retention period is preferably longer.

In addition, the conventional semiconductor device has a problem in that power consumption is high because voltage necessary for operation is high and that a memory element deteriorates by voltage applied.

Further, the conventional semiconductor device has a problem in that data cannot be written to a memory element after data is repeatedly written because tunnel current is generated in a memory transistor at the time of writing data and the memory element deteriorates.

It is an object of one embodiment of the present invention to lengthen a data retention period in a semiconductor device or a semiconductor memory device. It is an object of one embodiment of the present invention to reduce power consumption. It is an object of one embodiment of the present invention to increase the number of times of writing of data to a memory element.

One embodiment of the present invention includes a memory circuit including a selection transistor and an output transistor. The selection transistor includes a first gate and a second gate. The threshold voltage of the selection transistor is adjusted as necessary by the voltage of the first gate and the voltage of the second gate, and current flowing between a source and a drain of the selection transistor is reduced as much as possible when the selection transistor is off so that a data retention period in the memory circuit is lengthened.

In one embodiment of the present invention, a channel formation layer of the output transistor and a layer serving as a gate of the selection transistor are formed using the same material. Thus, the channel formation layer of the output transistor and the layer serving as the gate of the selection transistor can be formed in the same step, so that the increase in the number of manufacturing steps is suppressed.

One embodiment of the present invention is a semiconductor memory device that includes a plurality of memory cells each including a first transistor having a first gate and a second gate and a second transistor arranged in I rows (I is a natural number of 2 or more) and J columns (J is a natural number). Each of the plurality of memory cells includes a first layer that includes a pair of impurity regions containing an impurity element imparting conductivity and serves as a channel formation layer of the second transistor; a second layer that is formed using the same material and at the same time as the first layer, is apart from the first layer, contains an impurity element, and serves as the second gate of the first transistor; a first insulating layer that is provided over the first layer and the second layer and serves as a gate insulating layer of the second transistor; a first conductive layer that overlaps with the first layer with the first insulating layer provided therebetween and serves as a gate of the second transistor; a semiconductor layer that overlaps with the second layer with the first insulating layer provided therebetween, is formed using a material which is different from the material of the first layer, and serves as a channel formation layer of the first transistor; a second conductive layer that is electrically connected to the semiconductor layer and serves as one of a source and a drain of the first transistor; a third conductive layer that is electrically connected to the first conductive layer and the semiconductor layer and serves as the other of the source and the drain of the first transistor; a second insulating layer that is provided over the semiconductor layer, the second conductive layer, and the third conductive layer and serves as a gate insulating layer of the first transistor; a fourth conductive layer that overlaps with the semiconductor layer with the second insulating layer provided therebetween and serves as the first gate of the first transistor; a third insulating layer provided over the second insulating layer and the fourth conductive layer; and a fifth conductive layer that is electrically connected to one of the pair of impurity regions in the first layer through a first opening penetrating the first to third insulating layers and is electrically connected to the third conductive layer through a second opening penetrating the second and third insulating layers.

One embodiment of the present invention is a semiconductor memory device that includes a plurality of memory cells each including a first transistor having a first gate and a second gate and a second transistor arranged in I rows (I is a natural number of 2 or more) and J columns (J is a natural number). Each of the plurality of memory cells includes a first layer that includes a pair of impurity regions containing an impurity element imparting conductivity and serves as a channel formation layer of the second transistor; a second layer that is formed using the same material and at the same time as the first layer, is apart from the first layer, contains an impurity element, and serves as the second gate of the first transistor; a first insulating layer that is provided over the first layer and the second layer and serves as a gate insulating layer of the second transistor; a first conductive layer that overlaps with the first layer with the first insulating layer provided therebetween and serves as a gate of the second transistor; a semiconductor layer that overlaps with the second layer with the first insulating layer provided therebetween, is formed using a material which is different from the material of the first layer, and serves as a channel formation layer of the first transistor; a second conductive layer that is electrically connected to the semiconductor layer and serves as one of a source and a drain of the first transistor; a third conductive layer that is electrically connected to the first conductive layer and serves as the other of the source and the drain of the first transistor; a second insulating layer that is provided over the semiconductor layer, the second conductive layer, and the third conductive layer and serves as a gate insulating layer of the first transistor; a fourth conductive layer that overlaps with the semiconductor layer with the second insulating layer provided therebetween and serves as the first gate of the first transistor; and a fourth insulating layer provided over the third insulating layer and the fourth conductive layer. In the memory cells arranged in the same column, the first layers are formed using the same layer.

According to one embodiment of the present invention, a data retention period in a semiconductor device or a semiconductor memory device can be lengthened. Further, according to one embodiment of the present invention, the increase in the number of manufacturing steps can be suppressed.

BEST MODE FOR CARRYING OUT THE INVENTION

Examples of embodiments of the present invention will be described below with reference to the drawings. Note that it will be readily appreciated by those skilled in the art that details of the embodiments can be modified in various ways without departing from the spirit and scope of the present invention. The present invention is therefore not limited to the following description of the embodiments.

Note that the details of the embodiments can be combined with each other as appropriate. In addition, the details of the embodiments can be replaced with each other.

Ordinal numbers such as "first" and "second" are used in order to avoid confusion among components; however, the number of components is not limited by the number of ordinal numbers.

Embodiment 1

In this embodiment, an example of a semiconductor device that includes a memory circuit capable of storing data for a certain period is described.

Note that a memory circuit is a circuit capable of storing electrical charge to be data for a certain period.

The example of the semiconductor device in this embodiment includes a memory circuit.

An example of the memory circuit is described with reference to FIGS. 1A to 1C.

First, a structure example of the memory circuit in the semiconductor device in this embodiment is described with reference to FIG. 1A.

Figure 1A:
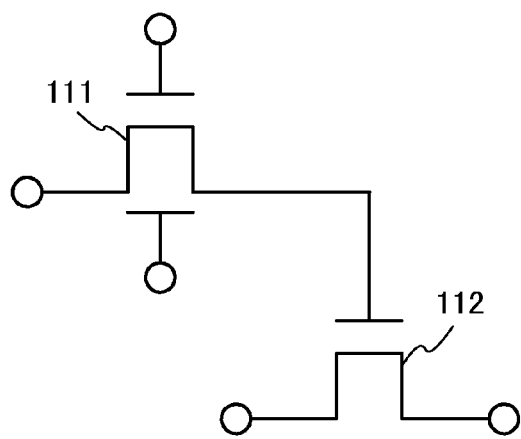
FIGS. 1A to 1C illustrate an example of an explanation of a memory circuit in a semiconductor device in Embodiment 1.

The memory circuit illustrated in FIG. 1A includes a transistor 111 and a transistor 112.

Note that in the semiconductor device, the transistor includes two terminals and a current control terminal for controlling current flowing between the two terminals by voltage applied. Note that without limitation to the transistor, in an element, terminals where current flowing therebetween is controlled are also referred to as current terminals. Two current terminals are also referred to as a first current terminal and a second current terminal.

Further, in the semiconductor device, a field-effect transistor can be used as the transistor, for example. In a field-effect transistor, a first current terminal, a second current terminal, and a current control terminal are one of a source and a drain, the other of the source and the drain, and a gate, respectively.

The term "voltage" generally means a difference between potentials at two points (also referred to as a potential difference). However, levels of voltage and potentials are represented by volts (V) in a circuit diagram or the like in some cases, so that it is difficult to distinguish them. Thus, in this specification, a potential difference between a potential at one point and a potential to be a reference (also referred to as a reference potential) is used as voltage at the point in some cases unless otherwise specified.

The transistor 111 includes a source, a drain, a first gate, and a second gate. The threshold voltage (also referred to as voltage Vth) of the transistor 111 is controlled by the voltage of the first gate or the second gate. For example, in the case where the transistor 111 is an n-channel transistor, the threshold voltage of the transistor 111 is shifted positively as the voltage of the second gate of the transistor 111 becomes lower.

The transistor 111 serves as a selection transistor for selecting whether data is input to the memory circuit.

As the transistor 111, a transistor including an oxide semiconductor layer in which a channel is formed can be used, for example. The oxide semiconductor layer has a wider bandgap than silicon and is an intrinsic (i-type) or substantially intrinsic semiconductor layer in which the number of carriers is extremely small and the carrier concentration is lower than $1\times10^{14}/cm^3$, preferably lower than $1\times10^{12}/cm^3$, more preferably lower than $1\times10^{11}/cm^3$.

The off-state current per micrometer of channel width of the transistor including an oxide semiconductor layer is lower than or equal to 10 aA ($1\times10^{-17}$ A), preferably lower than or equal to 1 aA ($1\times10^{-18}$ A), more preferably lower than or equal to 10 zA ($1\times10^{-20}$ A), much more preferably lower than or equal to 1 zA ($1\times10^{-21}$ A), still more preferably lower than or equal to 100 yA ($1\times10^{-22}$ A).

Since the oxide semiconductor layer has low carrier concentration, the off-state current of the transistor including an oxide semiconductor layer is low even when temperature changes. For example, even when the temperature of the transistor is 150° C., the off-state current per micrometer of channel width of the transistor can be 100 zA.

As the oxide semiconductor layer, for example, an oxide semiconductor layer containing crystals aligned perpendicular to a surface of the layer (crystals with c-axis alignment) can be used. For example, an oxide semiconductor film is deposited while the temperature of a substrate is set higher than or equal to 100° C. and lower than or equal to 500° C., and then the oxide semiconductor film is subjected to heat treatment, so that an oxide semiconductor layer containing crystals aligned perpendicular to a surface of the layer can be formed. Alternatively, the oxide semiconductor layer may be a stack of a plurality of oxide semiconductor layers. With the use of the oxide semiconductor layer containing crystals aligned perpendicular to the surface of the layer, a change in electrical characteristics of a transistor due to light can be suppressed, for example.

A gate of the transistor 112 is connected to the source or the drain of the transistor 111.

Note that in this specification, when two or more components are electrically connected to each other, the two or more components can be regarded as being connected to each other.

As the transistor 112, for example, it is possible to use a transistor including a semiconductor layer in which a channel is formed and a semiconductor that belongs to Group 14 in the periodic table (e.g., silicon) is contained.

Next, an example of a method for driving the memory circuit in FIG. 1A is described.

In the case where data is written to the memory circuit, first, the transistor 111 is turned on. For example, when the levels of the voltages of the first gate and the second gate of the transistor 111 are set to predetermined levels, the transistor 111 can be turned on.

When the transistor 111 is on, a data signal is input to the gate of the transistor 112 through the source and the drain of the transistor 111, and the voltage of the gate of the transistor 112 has a level that is similar to the level of the voltage of the data signal input.

Then, the transistor 111 is turned off. At this time, the amount of current flowing between the source and the drain of the transistor 111 is preferably as small as possible. Thus, the level of the voltage of the second gate of the transistor 111 is set to a predetermined level so that the threshold voltage of the transistor 111 is adjusted, and the amount of current flowing between the source and the drain of the transistor 111 at the time when the transistor 111 is off is reduced as much as possible.

An example of how the threshold voltage of the transistor 111 is adjusted is described with reference to FIG. 1B.

Figure 1B:
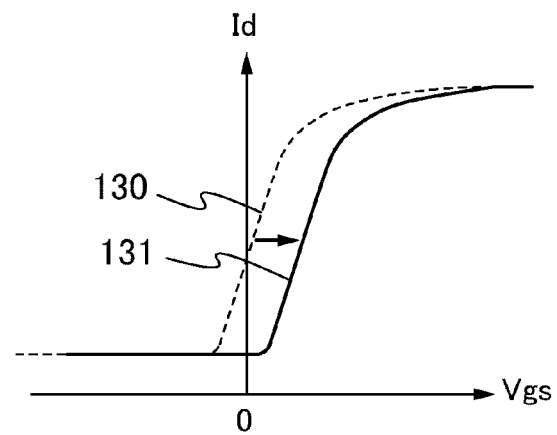

As illustrated in FIG. 1B, for example, when the voltage of the second gate of the transistor 111 has a level that is similar to the level of a ground potential GND, the relation between voltage (also referred to as voltage Vgs) applied between the first gate and the source of the transistor 111 and current (also referred to as current Id) flowing between the source and the drain of the transistor 111 is represented by a curve 130. At this time, the threshold voltage of the transistor 111 is voltage Vth_A.

On the other hand, when the voltage of the second gate of the transistor 111 is voltage VA having a predetermined level, the relation between the voltage Vgs and the current Id can be represented by a curve 131. At this time, the threshold voltage of the transistor 111 is voltage Vth_B that is higher than the voltage Vth_A in a positive direction.

As described above, by adjustment of the voltage of the second gate of the transistor 111, the threshold voltage of the transistor 111 can be adjusted.

In addition, resistance between a source and a drain of the transistor 112 depends on the voltage of the gate of the transistor 112. Thus, when the voltage of one of the source and the drain of the transistor 112 is voltage VB having a predetermined level, the voltage of the other of the source and the drain of the transistor 112 that is set in accordance with current flowing between the source and the drain of the transistor 112 can be read from the memory circuit as data. Further, the voltage of the other of the source and the drain of the transistor 112 can be read from the memory circuit as data more than once.

A structure example of the memory circuit illustrated in FIG. 1A is described with reference to FIG. 1C. FIG. 1C is a schematic diagram illustrating a structure example of the memory circuit illustrated in FIG. 1A. Note that although FIG. 1C illustrates the case where the output transistor is a top-gate transistor, this embodiment is not limited to this. The output transistor may be a bottom-gate transistor.

Figure 1C:
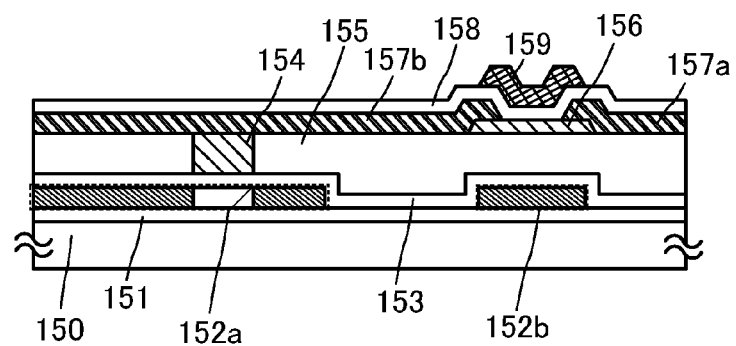

The memory circuit illustrated in FIG. 1C includes a semiconductor layer 152a, a semiconductor layer 152b, an insulating layer 153, a conductive layer 154, an insulating layer 155, a conductive layer 157a, a conductive layer 157b, an insulating layer 158, and a conductive layer 159. Note that the insulating layer 155 is not necessarily provided.

Each of the semiconductor layers 152a and 152b is formed over one surface of a substrate 150 with an insulating layer 151 provided therebetween.

As the substrate 150, a glass substrate, a quartz substrate, a semiconductor substrate, or a plastic substrate can be used, for example.

As the insulating layer 151, a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, or a hafnium oxide layer can be used, for example. The insulating layer 151 can be a stack of layers formed using materials that can be used for the insulating layer 151.

Note that the insulating layer 151 can have a function of preventing diffusion of an impurity element from the substrate 150.

The semiconductor layer 152a has a pair of impurity regions each containing an impurity element. The semiconductor layer 152a has a channel formation region between the pair of impurity regions and serves as a layer in which a channel is formed (such a layer is also referred to as a channel formation layer) in a transistor serving as the output transistor in the memory circuit. As the impurity element, an impurity element imparting n-type conductivity or an impurity element imparting p-type conductivity can be used. Alternatively, a plurality of impurity regions with different concentrations of impurity elements may be provided in the semiconductor layer 152a. In that case, a region in which the concentration of impurity elements is relatively low is referred to as a low-concentration impurity region. The provision of the low-concentration impurity region can suppress the local concentration of an electric field.

As the semiconductor layer 152a, a layer containing an amorphous semiconductor, a microcrystalline semiconductor, a polycrystalline semiconductor, or a single crystal semiconductor can be used, for example. As the semiconductor layer 152a, a semiconductor layer containing a semiconductor that belongs to Group 14 in the periodic table (e.g., silicon) can be used, for example.

The semiconductor layer 152b contains an impurity element. As the impurity element, an impurity element imparting n-type conductivity or an impurity element imparting p-type conductivity can be used. The semiconductor layer 152b serves as a second gate of a transistor that serves as a selection transistor in the memory circuit.

Note that a conductive layer serving as a second gate of the transistor is also referred to as a second gate electrode or a second gate line.

As the semiconductor layer 152b, a layer formed using the same material as the semiconductor layer 152a can be used. For example, a semiconductor layer formed using a material which can be used for the semiconductor layer 152a and the semiconductor layer 152b is formed over the insulating layer 151. In addition, by etching of part of the semiconductor layer, a semiconductor layer to be the semiconductor layer 152a and a semiconductor layer to be the semiconductor layer 152b are formed. Further, by addition of impurity elements to part of the semiconductor layer to be the semiconductor layer 152a and the semiconductor layer to be the semiconductor layer 152b, the semiconductor layer 152a and the semiconductor layer 152b can be formed using the same film in the same step. Note that the semiconductor layer 152b contains impurity elements imparting conductivity such that it can serve as a conductive layer and thus can be regarded as a conductive layer.

The insulating layer 153 is provided over the semiconductor layer 152a and the semiconductor layer 152b.

The insulating layer 153 serves as a gate insulating layer of a transistor that serves as the output transistor in the memory circuit.

As the insulating layer 153, a layer formed using a material which can be used for the insulating layer 151, an organic insulating material such as polyimide or acrylic, or the like can be used, for example. Alternatively, the insulating layer 153 may be a stack of layers formed using materials that can be used for the insulating layer 153.

Note that in the case where a semiconductor substrate is used as the substrate 150, the insulating layer 151, the semiconductor layer 152a, and the semiconductor layer 152b are not provided and a semiconductor substrate including a first semiconductor region corresponding to the semiconductor layer 152a and a second semiconductor region corresponding to the semiconductor layer 152b that are insulated from each other is used, and the insulating layer 153 may be formed over the first semiconductor region and the second semiconductor region.

The conductive layer 154 overlaps with the semiconductor layer 152a (including the channel formation region (the region between the pair of impurity regions)) with the insulating layer 153 provided therebetween.

The conductive layer 154 serves as a gate of the transistor that serves as the output transistor in the memory circuit. Note that such a conductive layer serving as a gate of the transistor is also referred to as a gate electrode or a gate line.

The conductive layer 154 can be, for example, a layer formed using a metal material such as molybdenum, titanium, chromium, tantalum, tungsten, aluminum, copper, neodymium, or scandium. Alternatively, the conductive layer 154 can be a stack of layers formed using materials that can be used for the conductive layer 154.

The insulating layer 155 is provided over the insulating layer 153. With provision of the insulating layer 155, for example, an uneven portion due to the conductive layer 154 can be flattened and formation of a layer in an upper portion is facilitated.

As the insulating layer 155, a layer formed using a material that can be used for the insulating layer 151 can be used, for example. Alternatively, the insulating layer 155 may be a stack of layers formed using materials that can be used for the insulating layer 155.

A semiconductor layer 156 overlaps with the semiconductor layer 152b with the insulating layer 153 and the insulating layer 155 provided therebetween.

The semiconductor layer 156 serves as a channel formation layer of the transistor that serves as the selection transistor in the memory circuit.

For the semiconductor layer 156, an In-based oxide, a Sn-based oxide, a Zn-based oxide, or the like can be used, for example. As the metal oxide, a four-component metal oxide, a three-component metal oxide, a two-component metal oxide, or the like can be used, for example. Note that a metal oxide which can be used as the oxide semiconductor may include gallium as a stabilizer for reducing variation in characteristics. A metal oxide which can be used as the oxide semiconductor may include tin as a stabilizer. The metal oxide which can be used as the oxide semiconductor may include hafnium as the stabilizer. The metal oxide which can be used as the oxide semiconductor may include aluminum as the stabilizer. The metal oxide which can be used as the oxide semiconductor may include one or more of the following as the stabilizer: lanthanum, cerium, praseodymium, neodymium, samarium, europium, gadolinium, terbium, dysprosium, holmium, erbium, thulium, ytterbium, and lutetium, which are lanthanoid. The metal oxide which can be used as the oxide semiconductor may include silicon oxide. For example, as the four-component metal oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, an In—Hf—Al—Zn-based oxide, or the like can be used. For example, as the three-component metal oxide, an In—Ga—Zn-based oxide (also referred to as IGZO), an In—Sn—Zn-based oxide (also referred to as ITZO), an In—Al—Zn-based oxide, Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, or the like can be used. For example, as the two-component metal oxide, an In—Zn-based oxide (also referred to as IZO), a Sn—Zn-based oxide, an Al—Zn-based oxide, a Zn—Mg-based oxide, a Sn—Mg-based oxide, an In—Mg-based oxide, an In—Sn-based oxide, an In—Ga-based oxide, or the like can be used.

In the case where an In—Zn—O-based metal oxide is used, for example, an oxide target having the following composition ratios can be used for formation of an In—Zn—O-based metal oxide semiconductor layer: In:Zn=50:1 to 1:2 (In$_2$O$_3$:ZnO=25:1 to 1:4 in a molar ratio), preferably In:Zn=20:1 to 1:1 (In$_2$O$_3$:ZnO=10:1 to 1:2 in a molar ratio), more preferably In:Zn=15:1 to 1.5:1 (In$_2$O$_3$:ZnO=15:2 to 3:4 in a molar ratio). For example, when the atomic ratio of the target used for the formation of the In—Zn—O-based oxide semiconductor is expressed by In:Zn:O=P:Q:R, R>1.5P+Q. The increase in the In content makes the mobility of the transistor higher.

As the oxide semiconductor, a material represented by InLO$_3$(ZnO)$_m$ (m is larger than 0) can be used. Here, L in InLO$_3$(ZnO)$_m$ represents one or more metal elements selected from Ga, Al, Mn, or Co.

The conductive layer 157a is electrically connected to the semiconductor layer 156.

The conductive layer 157a serves as one of a source and a drain of the transistor that serves as the selection transistor in the memory circuit. Note that a conductive layer serving as a source of a transistor is also referred to as a source electrode or a source wiring, and a conductive layer serving as a drain of a transistor is also referred to as a drain electrode or a drain wiring.

The conductive layer 157a can be, for example, a layer formed using a metal material such as aluminum, chromium, copper, tantalum, titanium, molybdenum, or tungsten.

Alternatively, the conductive layer 157a can be a layer containing a conductive metal oxide. As the conductive metal oxide, a metal oxide such as indium oxide (In$_2$O$_3$), tin oxide (SnO$_2$), zinc oxide (ZnO), an alloy of indium oxide and tin oxide (In$_2$O$_3$—SnO$_2$, which is abbreviated to ITO in some cases), or an alloy of indium oxide and zinc oxide (In$_2$O$_3$—ZnO); or the metal oxide containing silicon, silicon oxide, or nitrogen can be used, for example. Alternatively, the conductive layer 157a can be a stack of layers formed using materials that can be used for the conductive layer 157a.

The conductive layer 157b is electrically connected to the conductive layer 154 and the semiconductor layer 156.

Note that in FIG. 1C, the conductive layer 157b is in contact with the conductive layer 154. Although this embodiment is not limited to this, with a structure where the conductive layer 157b is in contact with the conductive layer 154, a contact area can be made larger than a contact area at the time when the conductive layer 157b is electrically connected to the conductive layer 154 through an opening in an insulating layer. Thus, contact resistance can be reduced.

The conductive layer 157b serves as the other of the source and the drain of the transistor that serves as the selection transistor in the memory circuit.

As the conductive layer 157b, a layer formed using the same material as the conductive layer 157a can be used, for example. Alternatively, the conductive layer 157b can be a stack of layers formed using materials that can be used for the conductive layer 157a.

For example, a conductive layer formed using a material that can be used for the conductive layer 157a and the conductive layer 157b is formed over the conductive layer 154, the insulating layer 155, and the semiconductor layer 156. In addition, by etching of part of the conductive layer, the conductive layer 157a and the conductive layer 157b can be formed using the same layer in the same step.

The insulating layer 158 is formed over the semiconductor layer 156, the conductive layer 157a, and the conductive layer 157b.

The insulating layer 158 serves as a gate insulating layer of the transistor that serves as the selection transistor in the memory circuit.

As the insulating layer 158, a layer formed using a material that can be used for the insulating layer 151 can be used. Alternatively, the insulating layer 158 can be a stack of layers formed using materials that can be used for the insulating layer 151.

Alternatively, as the insulating layer 158, an insulating layer of a material containing an element that belongs to Group 13 in the periodic table and an oxygen element can be used. When the semiconductor layer 156 contains an element that belongs to Group 13, the use of an insulating layer containing an element that belongs to Group 13 as an insulating layer in contact with the semiconductor layer 156 makes the state of an interface between the insulating layer and the oxide semiconductor layer favorable.

Examples of the material containing an element that belongs to Group 13 include gallium oxide, aluminum oxide, aluminum gallium oxide, and gallium aluminum oxide. Note that aluminum gallium oxide is a substance in which the aluminum content is higher than that of gallium in atomic percent (at. %), and gallium aluminum oxide is a substance in which the gallium content is higher than or equal to that of aluminum in atomic percent (at. %). A material represented by AlO$_x$ (x=3+α, where α is larger than 0 and smaller than 1), GaO$_x$, or Ga$_x$Al$_{2-x}$O$_{3+\alpha}$ (X is larger than 0 and smaller than 2 and α is larger than 0 and smaller than 1) can be used, for example.

For example, the use of an insulating layer containing gallium oxide as the insulating layer 158 can suppress accumulation of hydrogen or hydrogen ions at an interface between the insulating layer 158 and the semiconductor layer 156.

For example, the use of an insulating layer containing aluminum oxide as the insulating layer 158 can suppress accumulation of hydrogen or hydrogen ions at the interface between the insulating layer 158 and the semiconductor layer 156. The insulating layer containing aluminum oxide is less likely to transmit water; thus, the use of the insulating layer containing aluminum oxide can reduce entry of water to the oxide semiconductor layer through the insulating layer.

For example, the insulating layer 158 may be formed using a stack of a plurality of layers containing gallium oxide represented by GaO$_x$. Alternatively, the insulating layer 158 may be formed using a stack of an insulating layer containing gallium oxide represented by GaO$_x$ and an insulating layer containing aluminum oxide represented by AlO$_x$.

The conductive layer 159 overlaps with the semiconductor layer 156 with the insulating layer 158 provided therebetween.

The conductive layer 159 serves as a first gate of the transistor that serves as the selection transistor in the memory circuit. Note that such a conductive layer serving as a first gate of the transistor is also referred to as a first gate electrode or a first gate line.

As the conductive layer 159, a layer formed using a material that can be used for the conductive layer 157a can be used. Alternatively, the conductive layer 159 may be a stack of layers formed using materials that can be used for the conductive layer 159. The above is the structure example of the memory cell illustrated in FIG. 1A.

As described with reference to FIGS. 1A to 1C, an example of the semiconductor device in this embodiment includes a memory circuit.

In addition, the memory circuit in the example of the semiconductor device in this embodiment includes at least the selection transistor and the output transistor that are field-effect transistors.

Further, in the memory circuit in the example of the semiconductor device in this embodiment, the selection transistor includes the first gate and the second gate.

Further, the memory circuit in the example of the semiconductor device in this embodiment includes the conductive layer that serves as the second gate of the selection transistor, is apart from the semiconductor layer serving as the channel formation layer of the output transistor, and is formed using the same material as the semiconductor layer.

With the above structure, the threshold voltage of the selection transistor is adjusted as necessary so that the amount of current flowing between the source and the drain of the selection transistor in an off state can be reduced as much as possible. Thus, a data retention period in the memory circuit can be lengthened.

In addition, with the above structure, voltage necessary for writing and reading data can be made lower than that of a conventional semiconductor device; thus, power consumption can be reduced.

Further, with the above structure, data can be written by input of a data signal to a gate of the output transistor; thus, data writable frequency can be increased.

Furthermore, with the above structure, the semiconductor layer serving as the channel formation layer of the output transistor and the conductive layer serving as the second gate of the selection transistor can be formed concurrently with the use of the layer of the same material in the same step. Thus, the increase in the number of manufacturing steps and the increase in manufacturing cost can be suppressed.

Embodiment 2

In this embodiment, an example of a NOR-type semiconductor memory device is described as an example of the semiconductor device in the above embodiment.

An example of a semiconductor memory device in this embodiment includes a memory cell array including a plurality of memory cells arranged in matrix of I rows (I is a natural number of 2 or more) and J columns (J is a natural number). The memory cell corresponds to the memory circuit in the semiconductor memory device in the above embodiment.

An example of the memory cell array in the semiconductor memory device in this embodiment is described with reference to FIGS. 2A and 2B.

First, an example of the circuit structure of the memory cell array in the semiconductor memory device in this embodiment is described with reference to FIG. 2A.

Figure 2A:
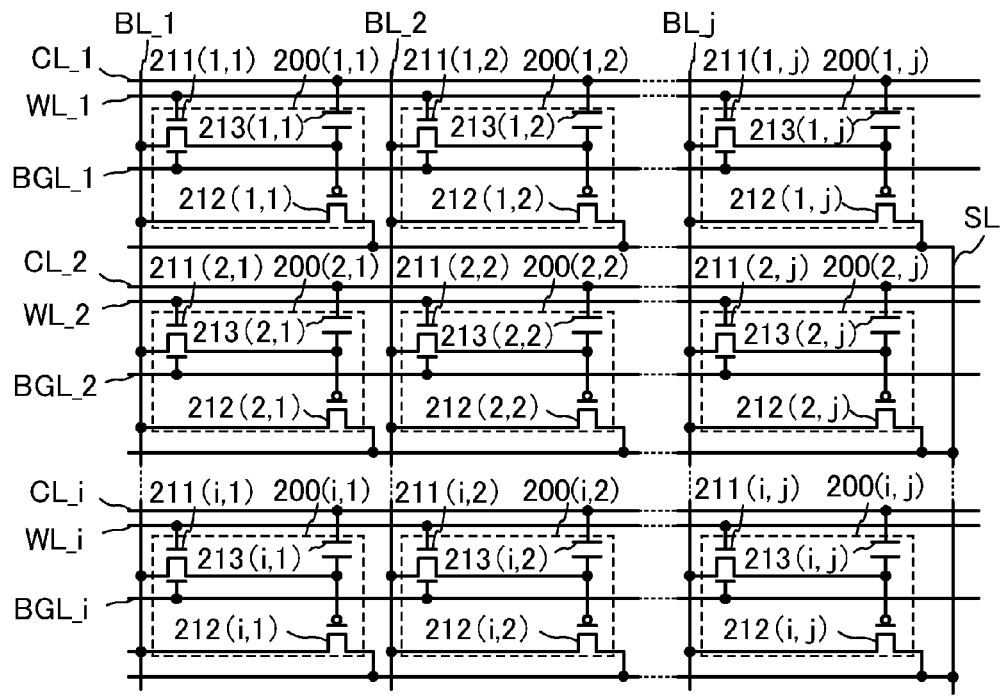
FIGS. 2A and 2B illustrate an example of an explanation of a memory cell array in a semiconductor memory device in Embodiment 2.

The memory cell array illustrated in FIG. 2A includes a plurality of memory cells 200 arranged in matrix of i rows (i is a natural number of 3 or more) and j columns (j is a natural number of 3 or more), i word lines WL (word lines WL_1 to WL_i), i capacitor lines CL (capacitor lines CL_1 to CL_i), i gate lines BGL (gate lines BGL_1 to BGL_i), j bit lines BL (bit lines BL_1 to BL_j), and a source line SL.

The memory cell 200 in an M-th row (M is a natural number of i or less) and an N-th column (N is a natural number of j or less) (such a memory cell is referred to as a memory cell 200 (M, N)) includes a transistor 211 (M, N), a capacitor 213 (M, N), and a transistor 212 (M, N).

Note that in the semiconductor memory device, the capacitor includes a first capacitor electrode, a second capacitor electrode, and a dielectric layer overlapping with the first capacitor electrode and the second capacitor electrode. Electrical charge is accumulated in the capacitor in accordance with voltage applied between the first capacitor electrode and the second capacitor electrode.

The transistor 211 (M, N) is an n-channel transistor, which includes a source, a drain, a first gate, and a second gate. Note that in the semiconductor memory device in this embodiment, the transistor 211 does not always need to be an n-channel transistor.

One of the source and the drain of the transistor 211 (M, N) is connected to the bit line BL_N. The first gate of the transistor 211 (M, N) is connected to the word line WL_M. The second gate of the transistor 211 (M, N) is connected to the gate line BGL_M. With the structure where the one of the source and the drain of the transistor 211 (M, N) is connected to the bit line BL_N, data can be read selectively from one or more memory cells.

The transistor 211 (M, N) serves as a selection transistor in the memory cell 200 (M, N).

As the transistor 211 (M, N), a transistor including an oxide semiconductor layer that can be used as the transistor 111 in the semiconductor device in Embodiment 1 can be used, for example.

The transistor 212 (M, N) is a p-channel transistor. Note that in the semiconductor memory device in this embodiment, the transistor 212 does not always need to be a p-channel transistor.

One of a source and a drain of the transistor 212 (M, N) is connected to the source line SL. The other of the source and the drain of the transistor 212 (M, N) is connected to the bit line BL_N. A gate of the transistor 212 (M, N) is connected to the other of the source and the drain of the transistor 212 (M, N).

The transistor 212 (M, N) serves as an output transistor in the memory cell 200 (M, N).

As the transistor 212 (M, N), a transistor including a semiconductor layer containing a semiconductor belonging to Group 14 (e.g., silicon) that can be used as the transistor 112 in the semiconductor device in Embodiment 1 can be used.

A first capacitor electrode of the capacitor 213 (M, N) is connected to the capacitor line CL_M. A second capacitor electrode of the capacitor 213 (M, N) is connected to the other of the source and the drain of the transistor 211 (M, N).

The capacitor 213 (M, N) serves as a storage capacitor.

The voltage of the word lines WL_1 to WL_i is controlled by, for example, a driver circuit including a decoder.

The voltage of the bit lines BL_1 to BL_j is controlled by, for example, a driver circuit including a decoder.

The voltage of the capacitor lines CL_1 to CL_i is controlled by, for example, a driver circuit including a decoder.

The voltage of the gate lines BGL_1 to BGL_i is controlled by, for example, a gate line driver circuit.

The gate line driver circuit is formed using, for example, a circuit that includes a diode and a capacitor. In that case, a first capacitor electrode of the capacitor is electrically connected to an anode of the diode and the gate line BGL.

Further, an example of a method for driving the memory cell array in FIG. 2A is described with reference to FIG. 2B. FIG. 2B is a timing chart illustrating an example of a method for driving the memory cell array in FIG. 2A. Here, the case where data is sequentially written to the memory cell 200 (1, 1) in a first row and a first column and the memory cell 200 (2, 2) in a second row and a second column and then the data written is read is described as an example. Note that in the timing chart in FIG. 2B, voltage Vh is higher than the threshold voltage of the transistor 211, and a shaded area is an area where voltage may be equal to the voltage Vh or the ground potential GND.

Figure 2B:
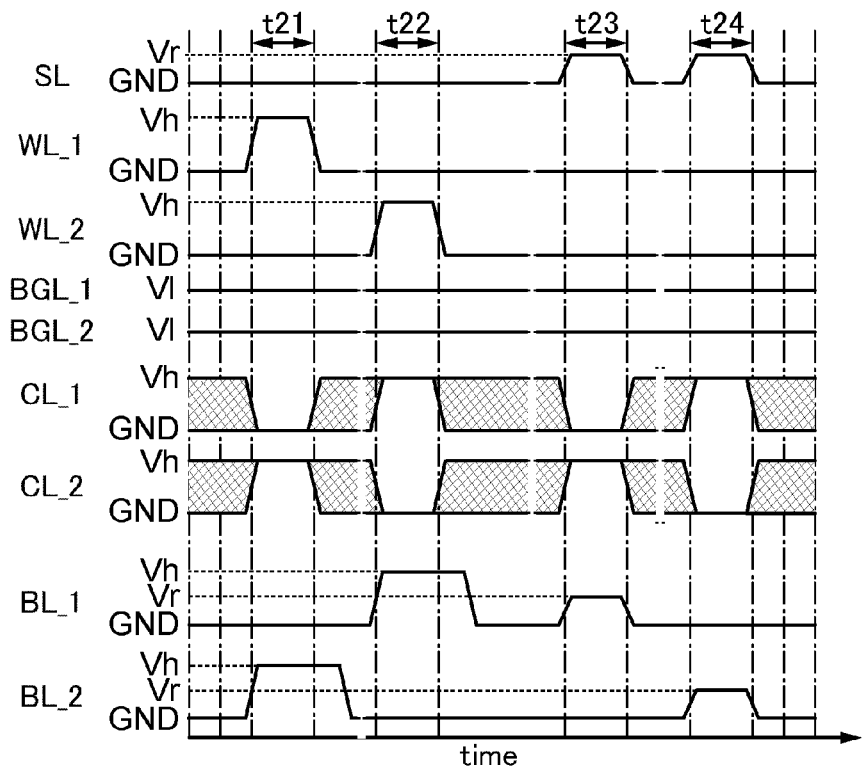

First, as illustrated by a period t21 in FIG. 2B, the voltage of the word line WL_1 is set to the voltage Vh. At this time, the voltage of the capacitor line CL_1 is set equal to the ground potential GND. In addition, the voltage of the word lines WL other than the word line WL_1 is set equal to the ground potential GND that is a reference potential, and the voltage of the capacitor lines CL other than the capacitor line CL_1 is set to the voltage Vh. Further, the voltage of the source line SL is set equal to the ground potential GND.

At this time, in the memory cells 200 in the first row (the memory cells 200 (1, 1) to 200 (1, j)), the transistors 211 (1, 1) to 211 (1, j) are turned on.

When the transistors 211 (1, 1) to 211 (1, j) are on, a memory data signal is input from the bit line BL_1 to the gate of the transistor 212 (1, 1) and a second capacitor electrode of the capacitor 213 (1, 1) through the transistor 211 (1, 1). At this time, the voltage of the gate of the transistor 212 (1, 1) and the voltage of the second capacitor electrode of the capacitor 213 (1, 1) have the same level as the voltage of the memory data signal input, and the memory cell 200 (1, 1) in the first row and the first column is set to be in a write state. Here, the voltage of the bit line BL_1 is set equal to the ground potential GND, as an example.

After data is written to the memory cells 200 in the first row (including the memory cell 200 (1, 1) in the first row and the first column), the voltage of the word line WL_1 is set equal to the ground potential GND, and the voltage of the capacitor line CL_1 is, for example, kept at the ground potential GND. At this time, the voltage of the word lines WL other than the word line WL_1 is equal to the ground potential GND, and the voltage of the capacitor lines CL other than the capacitor line CL_1 is, for example, kept at the voltage Vh. In addition, the voltage of the gate line BGL_1 in the first row is set to V1. The voltage V1 is lower than or equal to the ground potential GND.

At this time, the transistors 211 (1, 1) to 211 (1, j) are turned off. In addition, the threshold voltage of the transistors 211 (1, 1) to 211 (1, j) has a positive level. Thus, the voltage of second capacitor electrodes of the capacitors 213 (1, 1) to 213 (1, j) and the voltage of gates of the transistors 212 (1, 1) to 212 (1, j) are held for a certain period.

Next, as illustrated by a period t22 in FIG. 2B, the voltage of the word line WL_2 is set to the voltage Vh, and the voltage of the capacitor line CL_2 is set equal to the ground potential GND. At this time, the voltage of the word lines WL other than the word line WL_2 is set equal to the ground potential GND, and the voltage of the capacitor lines CL other than the capacitor line CL_2 is set to the voltage Vh. Further, the voltage of the source line SL is set equal to the ground potential GND.

At this time, in the memory cells 200 in a second row (the memory cells 200 (2, 1) to 200 (2, j)), the transistors 211 (2, 1) to 211 (2, j) are turned on.

When the transistors 211 (2, 1) to 211 (2, j) are on, a memory data signal is input from the bit line BL_2 to the gate of the transistor 212 (2, 2) and a second capacitor electrode of the capacitor 213 (2, 2) through the transistor 211 (2, 2). At this time, the voltage of the gate of the transistor 212 (2, 2) and the voltage of the second capacitor electrode of the capacitor 213 (2, 2) have the same level as the voltage of the memory data signal input, and the memory cell 200 (2, 2) in the second row and the second column is set to be in a write state. Here, the voltage of the bit line BL_2 is set equal to the ground potential GND, as an example.

After data is written to the memory cells 200 in the second row (including the memory cell 200 (2, 1) in the second row and the first column), the voltage of the word line WL_2 is set equal to the ground potential GND, and the voltage of the capacitor line CL_2 is, for example, set to the ground potential GND. At this time, the voltage of the word lines WL other than the word line WL_2 is equal to the ground potential GND, and the voltage of the capacitor lines CL other than the capacitor line CL_2 is, for example, set to the voltage Vh. In addition, the voltage of the gate line BGL_2 is set to V1. The voltage of the bit lines BL_1 and BL_2 is set equal to the ground potential GND.

At this time, the transistors 211 (2, 1) to 211 (2, j) are turned off. In addition, the threshold voltage of the transistors 211 (2, 1) to 211 (2, j) has a positive level. Thus, the voltage of second capacitor electrodes of the capacitors 213 (2, 1) to 213 (2, j) and the voltage of gates of the transistors 212 (2, 1) to 212 (2, j) are held for a certain period.

Further, as illustrated by a period t23 in FIG. 2B, the voltage of the source line SL is set to voltage Vr, and the voltage of the capacitor line CL_1 is set equal to the ground potential GND. At this time, the voltage of the word lines WL_1 to WL_i is set equal to the ground potential GND, and the voltage of the capacitor lines CL other than the capacitor line CL_1 is set to the voltage Vh. The voltage Vr is higher than or equal to the ground potential GND and lower than or equal to the voltage Vh.

At this time, in the memory cell 200 (1, 1) in the first row and the first column, resistance between a source and a drain of the transistor 212 (1, 1) is based on the voltage of the gate of the transistor 212 (1, 1). Thus, data is read from the memory cell 200 (1, 1) by output of voltage based on the voltage of the gate of the transistor 212 (1, 1) as data through the bit line BL_1.

Next, as illustrated by a period t24 in FIG. 2B, the voltage of the source line SL is set to the voltage Vr, and the voltage of the capacitor line CL_2 is set equal to the ground potential GND. At this time, the voltage of the word lines WL_1 to WL_i is set equal to the ground potential GND, and the voltage of the capacitor lines CL other than the capacitor line CL_2 is set to the voltage Vh.

At this time, in the memory cell 200 (2, 2) in the second row and the second column, resistance between a source and a drain of the transistor 212 (2, 2) is based on the voltage of the gate of the transistor 212 (2, 2). Thus, data is read from the memory cell 200 (2, 2) by output of voltage based on the voltage of the gate of the transistor 212 (2, 2) as data through the bit line BL_1. The above is the example of the method for driving the memory cell array in FIG. 2A.

Figure 3A:
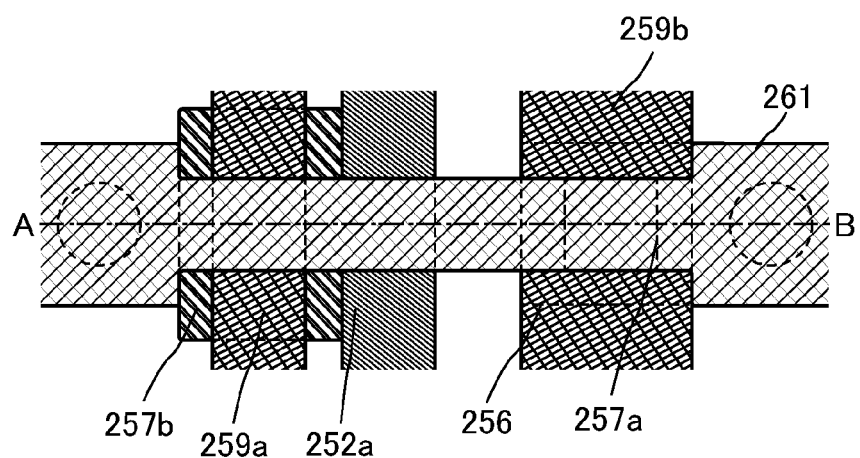
FIGS. 3A and 3B illustrate a structure example of a memory cell in the semiconductor memory device in Embodiment 2.

Next, a structure example of the memory cell 200 in the memory cell array in FIG. 2A is described with reference to FIGS. 3A and 3B. FIG. 3A is a top view and FIG. 3B is a cross-sectional view along line A-B in FIG. 3A.

Figure 3B:
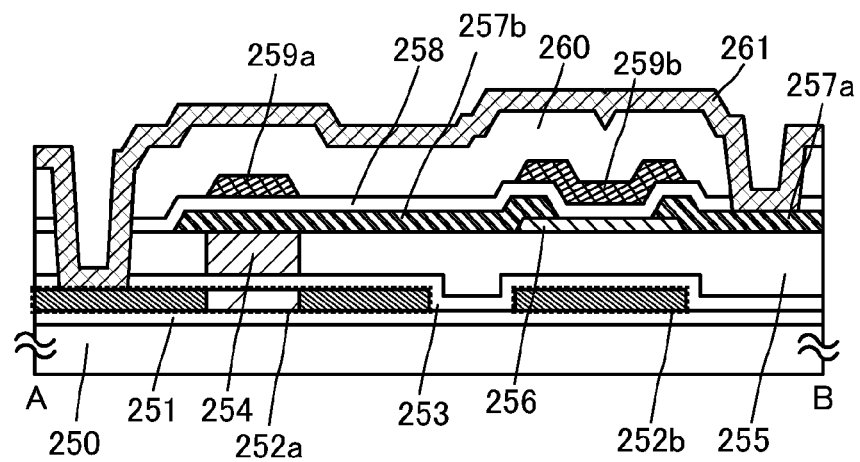

The memory cell illustrated in FIGS. 3A and 3B includes a semiconductor layer 252a, a semiconductor layer 252b, an insulating layer 253, a conductive layer 254, an insulating layer 255, a semiconductor layer 256, a conductive layer 257a, a conductive layer 257b, an insulating layer 258, a conductive layer 259a, a conductive layer 259b, an insulating layer 260, and a conductive layer 261. Note that the semiconductor memory device in this embodiment does not necessarily include the insulating layer 255.

Each of the semiconductor layers 252a and 252b is formed over one surface of a substrate 250 with an insulating layer 251 provided therebetween.

As the substrate 250, a substrate which can be used as the substrate 150 in Embodiment 1 can be used.

As the insulating layer 251, for example, an oxide insulating layer can be used. For example, a silicon oxide layer, a silicon oxynitride layer, or the like can be used. In addition, the oxide insulating layer may contain halogen. Note that the insulating layer 251 can be a stack of layers formed using materials that can be used for the insulating layer 251.

The semiconductor layer 252a has a pair of impurity regions. The semiconductor layer 252a has a channel formation region between the pair of impurity regions. An impurity element imparting p-type conductivity can be used as an impurity element; however, this embodiment is not limited to this. An impurity element imparting n-type conductivity may be used. Alternatively, a plurality of impurity regions with different concentrations of impurity elements may be provided in the semiconductor layer 252a. In that case, a region in which the concentration of impurity elements is relatively low is referred to as a low-concentration impurity region. The provision of the low-concentration impurity region can suppress the local concentration of an electric field.

The semiconductor layer 252a serves as a channel formation layer of a transistor that serves as an output transistor in a source line and each memory cell.

The semiconductor layer 252b contains the same impurity element as the impurity region in the semiconductor layer 252a. The semiconductor layer 252b is apart from the semiconductor layer 252a. Note that the semiconductor layer 252b contains impurity elements imparting conductivity such that it can serve as a conductive layer and thus can be regarded as a conductive layer.

The semiconductor layer 252b serves as a second gate of a transistor that serves as a selection transistor in the gate line BGL and each memory cell.

As the semiconductor layer 252a and the semiconductor layer 252b, a layer formed using a material that can be used for the semiconductor layer 152a and the semiconductor layer 152b in the above embodiment can be used, for example.

The insulating layer 253 is provided over the semiconductor layer 252a and the semiconductor layer 252b.

The insulating layer 253 serves as a gate insulating layer of a transistor that serves as an output transistor in each memory cell.

As the insulating layer 253, a layer formed using a material that can be used for the insulating layer 151 in Embodiment 1 can be used, for example. Alternatively, the insulating layer 253 can be a stack of layers formed using materials that can be used for the insulating layer 253.

The conductive layer 254 overlaps with the semiconductor layer 252a (including the channel formation region) with the insulating layer 253 provided therebetween. Note that a side surface of the conductive layer 254 may be tapered. When the side surface of the conductive layer 254 is tapered, formation of an upper layer can be facilitated.

The conductive layer 254 serves as a gate of a transistor that serves as an output transistor in the memory cell.

As the conductive layer 254, a layer formed using a material that can be used for the conductive layer 154 in Embodiment 1 can be used, for example. Alternatively, the conductive layer 254 can be a stack of layers formed using materials that can be used for the conductive layer 254.

The insulating layer 255 is provided over the insulating layer 253. With provision of the insulating layer 255, for example, an uneven portion due to the conductive layer 254 can be flattened and formation of a layer in an upper portion is facilitated.

As the insulating layer 255, a layer formed using a material that can be used for the insulating layer 151 in Embodiment 1 can be used, for example. Alternatively, the insulating layer 255 can be a stack of layers formed using materials that can be used for the insulating layer 255. For example, the insulating layer 255 can be formed using a stack of a silicon oxynitride layer, a silicon nitride oxide layer, and a silicon oxide layer.

The semiconductor layer 256 overlaps with the semiconductor layer 252b with the insulating layer 253 and the insulating layer 255 provided therebetween.

The semiconductor layer 256 serves as a channel formation layer of a transistor that serves as a selection transistor in the memory cell.

As the semiconductor layer 256, a layer formed using a material that can be used for the semiconductor layer 156 in Embodiment 1 can be used, for example.

The conductive layer 257a is electrically connected to the semiconductor layer 256.

The conductive layer 257a serves as one of a source and a drain of the transistor that serves as the selection transistor in the memory cell.

The conductive layer 257b is electrically connected to the conductive layer 254 and the semiconductor layer 256. With a structure where the conductive layer 257b is in contact with the conductive layer 254, a contact area can be made larger than a contact area at the time when the conductive layer 257b is electrically connected to the conductive layer 254 through an opening in an insulating layer. Thus, contact resistance can be reduced.

The conductive layer 257b serves as the other of the source and the drain of the transistor that serves as the selection transistor in the memory cell and also serves as a second capacitor electrode of a capacitor that serves as a storage capacitor in the memory cell.

As the conductive layer 257a and the conductive layer 257b, a layer formed using a material that can be used for the conductive layer 157a and the conductive layer 157b in Embodiment 1 can be used, for example. Alternatively, the conductive layer 257a and the conductive layer 257b can be a stack of layers formed using materials that can be used for the conductive layer 257a and the conductive layer 257b.

The insulating layer 258 is formed over the semiconductor layer 256, the conductive layer 257a, and the conductive layer 257b.

The insulating layer 258 serves as a gate insulating layer of the transistor that serves as the selection transistor in the memory cell and also serves as a dielectric layer of the capacitor that serves as the storage capacitor in the memory cell.

As the insulating layer 258, an insulating layer formed using a material that can be used for the insulating layer 158 in Embodiment 1 can be used, for example. Alternatively, the insulating layer 258 can be a stack of layers formed using materials that can be used for the insulating layer 258.

The conductive layer 259a overlaps with the conductive layer 257b with the insulating layer 258 provided therebetween.

The conductive layer 259a serves as a first capacitor electrode of the capacitor that serves as the storage capacitor in the memory cell.

The conductive layer 259b overlaps with the semiconductor layer 256 with the insulating layer 258 provided therebetween.

The semiconductor layer 259b serves as a first gate of a transistor that serves as a selection transistor in the word line WL and the memory cell.

As the conductive layer 259a and the conductive layer 259b, a layer formed using a material that can be used for the conductive layer 159 in Embodiment 1 can be used, for example. Alternatively, the conductive layer 259a and the conductive layer 259b can be a stack of layers formed using materials that can be used for the conductive layer 259a and the conductive layer 259b.

The insulating layer 260 is formed over the insulating layer 258, the conductive layer 259a, and the conductive layer 259b.

As the insulating layer 260, a layer formed using a material that can be used for the insulating layer 255 can be used, for example. Alternatively, the insulating layer 260 can be a stack of layers formed using materials that can be used for the insulating layer 260.

The conductive layer 261 is in contact with the conductive layer 257a through an opening formed in the insulating layer 258 and the insulating layer 260 and is in contact with one of the pair of impurity regions in the semiconductor layer 252a through an opening formed in the insulating layer 253, the insulating layer 255, the insulating layer 258, and the insulating layer 260.

The conductive layer 261 serves as the bit line BL in the memory cell.

As the conductive layer 261, a layer formed using a material that can be used for the conductive layer 254 can be used, for example. Alternatively, the conductive layer 261 can be a stack of layers formed using materials that can be used for the conductive layer 261.

An insulating layer may be provided over the conductive layer 261, and a different conductive layer that is electrically connected to the conductive layer 261 through an opening formed in the insulating layer may be provided over the insulating layer.

Note that in the memory cell of the semiconductor memory device in this embodiment, the level of voltage applied to the second gate or the thickness of the insulating layer 255 is set as appropriate so that the level of the threshold voltage of the transistor serving as the selection transistor can be changed into a desired level as necessary.

Next, an example of a method for manufacturing the memory cell in FIGS. 3A and 3B is described with reference to FIGS. 4A to 4D, FIGS. 5A to 5D, FIGS. 6A to 6C, and FIGS. 7A to 7C. FIGS. 4A to 4D, FIGS. 5A to 5D, FIGS. 6A to 6C, and FIGS. 7A to 7C are cross-sectional views illustrating an example of the method for manufacturing the memory cell in FIGS. 3A and 3B.

Figure 4A:
FIGS. 4A to 4D are cross-sectional views illustrating an example of a method for manufacturing the memory cell in FIGS. 3A and 3B.

First, as illustrated in FIG. 4A, the substrate 250 is prepared, the insulating layer 251 is formed over one surface of the substrate 250, and a semiconductor layer 242 is formed over the one surface of the substrate 250 with the insulating layer 251 provided therebetween. Note that an oxide insulating layer or a nitride insulating layer may be formed over the substrate 250 in advance.

An example in which the insulating layer 251 and the semiconductor layer 242 are formed over one surface of the substrate 250 is described below.

For example, the substrate 250 and a semiconductor substrate provided with the insulating layer 251 on an upper surface are prepared.

For example, an oxide insulating layer can be formed by formation of an oxide insulating film by thermal oxidation, CVD, sputtering, or the like. For example, the oxide insulating layer can be formed by formation of an oxide silicon film over the semiconductor substrate with thermal oxidation treatment in thermal oxidation.

In addition, an ion beam including ions which are accelerated by an electric field enters the semiconductor substrate and a fragile region is formed in a region at a certain depth from a surface of the semiconductor substrate. Note that the depth at which the fragile region is formed is adjusted by the kinetic energy, mass, electrical charge, or incidence angle of the ions, or the like.

For example, ions can be introduced into the semiconductor substrate with the use of an ion doping apparatus or an ion implantation apparatus.

As ions to be introduced, for example, hydrogen and/or helium can be used. For example, in the case where hydrogen ions are introduced using an ion doping apparatus, the efficiency of introduction of ions can be improved by increasing the proportion of $H_3^+$ in the ions introduced. Specifically, it is preferable that the proportion of $H_3^+$ is higher than or equal to 50% (more preferably, higher than or equal to 80%) with respect to the total amount of $H^+$, $H_2^+$, and $H_3^+$.

Further, the substrate 250 and the semiconductor substrate are attached to each other with the insulating layer on the semiconductor substrate provided therebetween. Note that in the case where the substrate 250 is also provided with an insulating layer, the substrate 250 and the semiconductor substrate are attached to each other with the insulating layer on the semiconductor substrate and the insulating layer over the substrate 250 provided therebetween. In that case, the insulating layers provided between the substrate 250 and the semiconductor substrate serves as the insulating layer 251.

Furthermore, heat treatment is performed so that the semiconductor substrate is separated with the fragile region used as a cleavage plane. Thus, the semiconductor layer 242 can be formed over one surface of the substrate 250 with the insulating layer 251 provided therebetween.

Note that when a surface of the semiconductor layer 242 is irradiated with laser light, the flatness of the surface of the semiconductor layer 242 can be improved.

Note that after the semiconductor layer 242 is formed, an impurity element imparting p-type or n-type conductivity may be added to the semiconductor layer 242. By addition of the impurity element imparting p-type or n-type conductivity to the semiconductor layer 242, the threshold voltage of the transistor including the semiconductor layer 242 can be easily controlled.

Without limitation to the above formation method, the semiconductor layer 242 may be formed by formation of a polycrystalline, microcrystalline, or amorphous semiconductor layer over the insulating layer 251 by CVD.

Figure 4B:
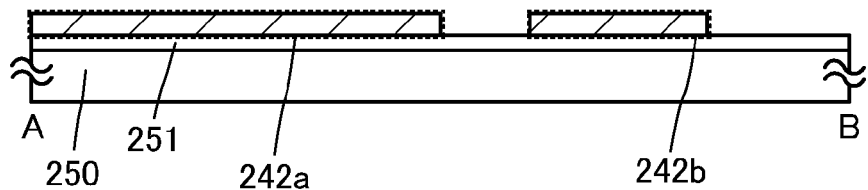

Next, as illustrated in FIG. 4B, by etching of part of the semiconductor layer 242, a semiconductor layer 242a and a semiconductor layer 242b which are apart from each other are formed.

For example, a resist mask is formed over part of a layer or a film by a photolithography process, and the part of the layer or the film can be etched using the resist mask. Note that in that case, the resist mask is removed after the etching.

The resist mask may be formed by an inkjet method. A photomask is not needed in an inkjet method; thus, manufacturing cost can be reduced. In addition, the resist mask may be formed using an exposure mask having a plurality of regions with different transmittances (such an exposure mask is also referred to as a multi-tone mask). With the multi-tone mask, a resist mask having a plurality of regions with different thicknesses can be formed, so that the number of resist masks used for the formation of the semiconductor memory device can be reduced.

Figure 4C:
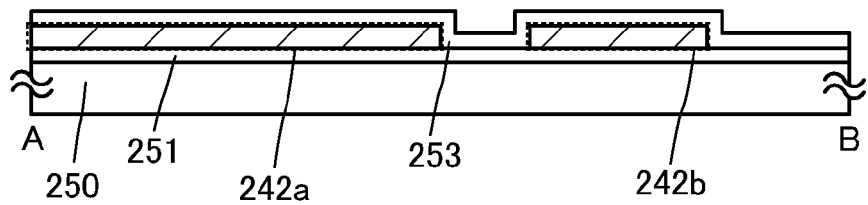

Next, as illustrated in FIG. 4C, the insulating layer 253 is formed over the semiconductor layer 242a and the semiconductor layer 242b.

For example, the insulating layer 253 can be formed by formation of a film formed using a material that can be used for the insulating layer 253 by sputtering, plasma-enhanced CVD, or the like. Alternatively, the insulating layer 253 can be a stack of films formed using materials that can be used for the insulating layer 253. Further, when the insulating layer 253 is formed by high-density plasma-enhanced CVD (e.g., high-density plasma-enhanced CVD using microwaves (e.g., microwaves with a frequency of 2.45 GHz)), the insulating layer 253 can be dense and can have higher breakdown voltage. Alternatively, the insulating layer 253 can be formed by heat treatment (e.g., thermal oxidation treatment or thermal nitriding treatment) or high-density plasma treatment. The high-density plasma treatment can be performed using, for example, a mixed gas of a rare gas such as He, Ar, Kr, or Xe and any of oxygen, nitrogen oxide, ammonia, nitrogen, or hydrogen.

Note that when a high-purity gas from which an impurity such as hydrogen, water, a hydroxyl group, or hydride is removed is used as a sputtering gas, for example, the impurity concentration in the film can be lowered.

Note that preheating treatment may be performed in a preheating chamber of a sputtering apparatus before the film is formed by sputtering. By the preheating treatment, an impurity such as hydrogen or moisture can be eliminated.

Before the film is formed by sputtering, for example, treatment by which voltage is applied to a substrate side, not to a target side, in an argon, nitrogen, helium, or oxygen atmosphere with the use of an RF power and plasma is generated so that a surface of the substrate on which the film is formed is modified (such treatment is also referred to as reverse sputtering) may be performed. By reverse sputtering, powdery substances (also referred to as particles or dust) that attach onto the surface on which the film is formed can be removed.

In the case where the film is formed by sputtering, moisture remaining in a deposition chamber for the film can be removed by an adsorption vacuum pump or the like. A cryopump, an ion pump, a titanium sublimation pump, or the like can be used as the adsorption vacuum pump. Alternatively, moisture remaining in the deposition chamber can be removed by a turbo-molecular pump provided with a cold trap.

Note that after the insulating layer 253 is formed, an impurity element imparting p-type or n-type conductivity may be added to part of the semiconductor layer 242a and part of the semiconductor layer 242b.

Figure 4D:
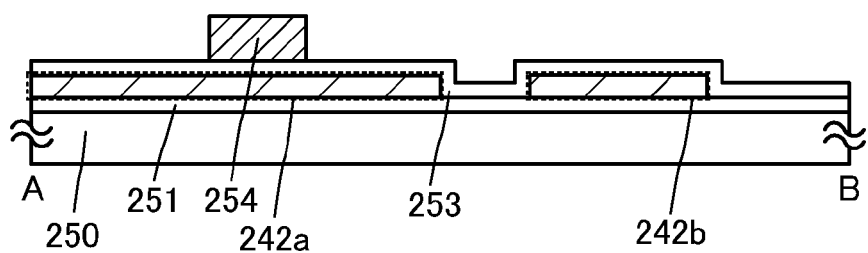

Then, as illustrated in FIG. 4D, a first conductive film is formed over at least part of the semiconductor layer 242a with the insulating layer 253 provided therebetween and is partly etched so that the conductive layer 254 is formed.

For example, the first conductive film can be formed by formation of a film formed using a material that can be used for the conductive layer 254 by sputtering. Alternatively, the first conductive film can be a stack of films formed using materials that can be used for the conductive layer 254.

Figure 5A:
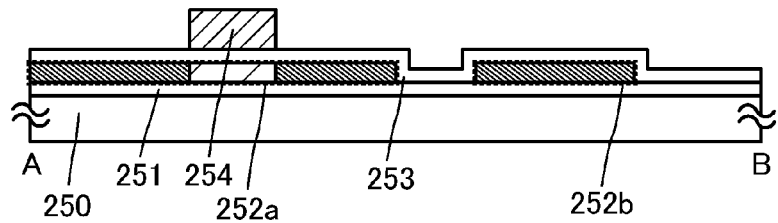
FIGS. 5A to 5D are cross-sectional views illustrating the example of a method for manufacturing the memory cell in FIGS. 3A and 3B.

Next, as illustrated in FIG. 5A, an impurity element imparting p-type or n-type conductivity is added to the semiconductor layer 242a and the semiconductor layer 242b with the use of the conductive layer 254 as a mask so that a channel formation region is formed to overlap with the conductive layer 254 in the semiconductor layer 242a, impurity regions are formed in a region other than that region, and an impurity region is formed in the semiconductor layer 242b so that the semiconductor layer 252a and the semiconductor layer 252b are formed.

Figure 5B:
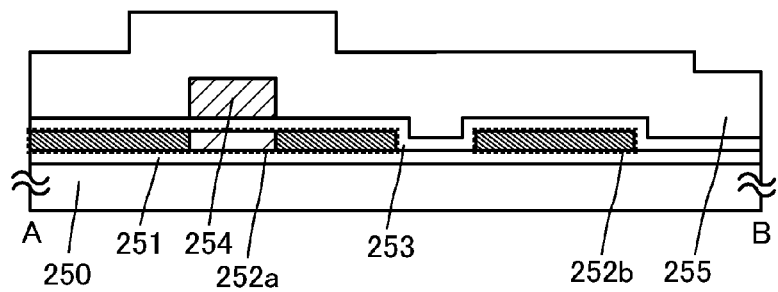

Next, as illustrated in FIG. 5B, the insulating layer 255 is formed by formation of a third insulating film over the insulating layer 253 and the conductive layer 254.

For example, the insulating layer 255 can be formed in such a manner that a silicon oxynitride film is formed over the insulating layer 253 and the conductive layer 254, a silicon nitride oxide film is formed over the silicon oxynitride film, and a silicon oxide film is formed over the silicon nitride oxide film.

Figure 5C:
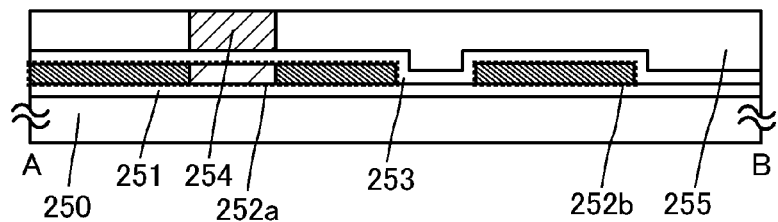

Then, as illustrated in FIG. 5C, an upper surface of the conductive layer 254 is exposed by removal of part of the insulating layer 255.

For example, the upper surface of the conductive layer 254 can be exposed by removal of the part of the insulating layer 255 by CMP (chemical mechanical polishing) or etching.

For example, in the case where a silicon oxynitride film, a silicon nitride oxide film, and a silicon oxide film are formed in that order so that the insulating layer 253 is formed, an upper surface of the silicon nitride oxide film may be exposed by CMP and an upper surface of the conductive layer 254 may be exposed by dry etching.

Figure 5D:
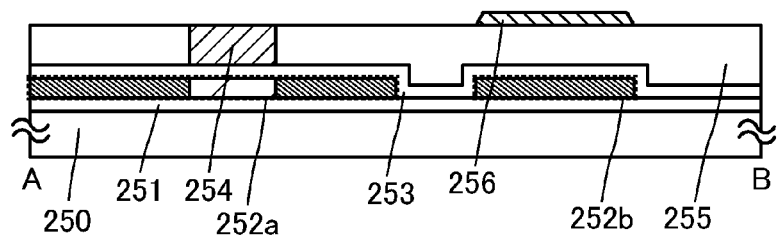

Then, as illustrated in FIG. 5D, an oxide semiconductor film is formed over the insulating layer 255 and is partly etched so that the semiconductor layer 256 is formed.

For example, the oxide semiconductor film can be formed by formation of a film formed using an oxide semiconductor material that can be used for the semiconductor layer 256 by sputtering. Note that the oxide semiconductor film may be formed in a rare gas atmosphere, an oxygen atmosphere, or a mixed atmosphere of a rare gas and oxygen. For example, by formation of the oxide semiconductor film in an oxygen atmosphere, a high-crystallinity oxide semiconductor film can be formed.

The oxide semiconductor film can be formed using an oxide target having a composition ratio of $In_2O_3:Ga_2O_3:ZnO=1:1:1$ (in a molar ratio) as a sputtering target. Alternatively, for example, the oxide semiconductor film may be formed using an oxide target having a composition ratio of $In_2O_3:Ga_2O_3:ZnO=1:1:2$ (in a molar ratio).

The proportion of the volume of a portion except for the area of a space and the like with respect to the total volume of the oxide target (such a proportion is also referred to as relative density) is preferably higher than or equal to 90% and lower than or equal to 100%, more preferably higher than or equal to 95% and lower than or equal to 99.9%. With the use of a metal oxide target with high relative density, the oxide semiconductor film can be a dense film.

When the oxide semiconductor film is formed by sputtering, the substrate 250 may be kept under reduced pressure and heated at 100 to 600° C., preferably 200 to 400° C. By heating of the substrate 250, the impurity concentration in the oxide semiconductor film can be lowered and damage to the oxide semiconductor film caused by the sputtering can be reduced.

Figure 6A:
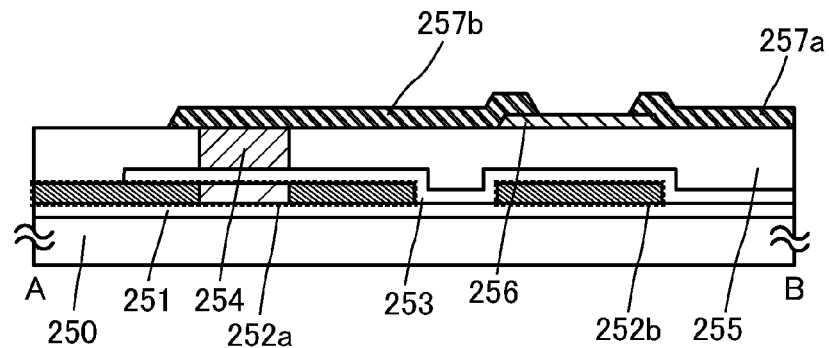
FIGS. 6A to 6C are cross-sectional views illustrating the example of a method for manufacturing the memory cell in FIGS. 3A and 3B.

Then, as illustrated in FIG. 6A, a second conductive film is formed over the conductive layer 254, the insulating layer 255, and the semiconductor layer 256 and is partly etched so that the conductive layer 257a and the conductive layer 257b are formed.

For example, the second conductive film can be formed by formation of a film formed using a material that can be used for the conductive layer 257a and the conductive layer 257b by sputtering or the like. Alternatively, the second conductive film can be a stack of films formed using materials that can be used for the conductive layer 257a and the conductive layer 257b.

Figure 6B:
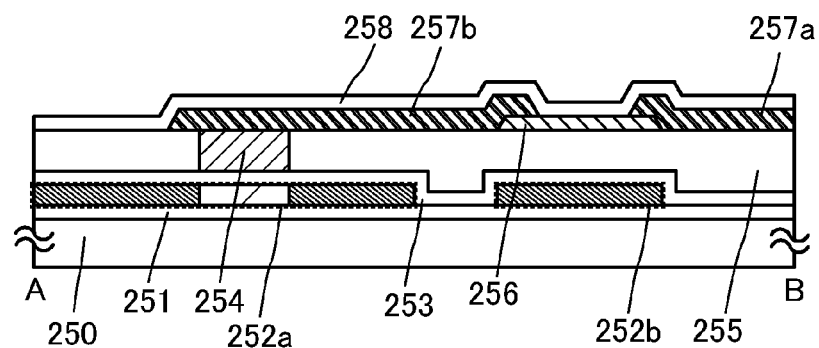

Then, as illustrated in FIG. 6B, the insulating layer 258 is formed to be in contact with the semiconductor layer 256.

Note that heat treatment may be performed at higher than or equal to 400° C. and lower than or equal to 750° C., or higher than or equal to 400° C. and lower than the strain point of the substrate after the oxide semiconductor film is formed, after part of the oxide semiconductor film is etched, after the second conductive film is formed, after part of the second conductive film is etched, or after the insulating layer 258 is formed.

Note that a heat treatment apparatus for the heat treatment can be an electric furnace or an apparatus for heating an object by heat conduction or heat radiation from a heater such as a resistance heater. For example, an RTA (rapid thermal annealing) apparatus such as a GRTA (gas rapid thermal annealing) apparatus, or an LRTA (lamp rapid thermal annealing) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus with which heat treatment is performed using a high-temperature gas. As the high-temperature gas, for example, a rare gas or an inert gas (e.g., nitrogen) which does not react with an object by heat treatment can be used.

After the heat treatment, a high-purity oxygen gas, a high-purity $N_2O$ gas, or ultra-dry air (with a dew point of −40° C. or lower, preferably −60° C. or lower) may be introduced into the furnace that has been used in the heat treatment while the heating temperature is maintained or decreased. In that case, it is preferable that water, hydrogen, and the like be not contained in the oxygen gas or the $N_2O$ gas. The purity of the oxygen gas or the $N_2O$ gas which is introduced into the heat treatment apparatus is preferably 6N or higher, more preferably 7N or higher. That is, the impurity concentration in the oxygen gas or the $N_2O$ gas is 1 ppm or lower, preferably 0.1 ppm or lower. By the action of the oxygen gas or the $N_2O$ gas, oxygen is supplied to the semiconductor layer 256, so that defects caused by oxygen deficiency in the semiconductor layer 256 can be reduced.

Further, in addition to the heat treatment, after the insulating layer 258 is formed, heat treatment (preferably at 200 to 400° C., for example, 250 to 350° C.) may be performed in an inert gas atmosphere or an oxygen gas atmosphere.

Further, oxygen doping treatment using oxygen plasma may be performed after the formation of the insulating layer 258, after the formation of the oxide semiconductor film, after the formation of the conductive layer serving as the source or the drain of the transistor that serves as the selection transistor, after the formation of the insulating layer, or after the heat treatment. For example, oxygen doping treatment may be performed using a high-density plasma of 2.45 GHz. Alternatively, the oxygen doping treatment may be performed by ion implantation or ion doping. By the oxygen doping treatment, variations in electrical characteristics of the transistors can be reduced. For example, the oxygen doping treatment is performed to make the insulating layer 258 contain oxygen with a higher proportion than that in the stoichiometric composition. Consequently, excess oxygen in the insulating layer is likely to be supplied to the semiconductor layer 256. This can reduce oxygen deficiency in the semiconductor layer 256 or at the interface between the insulating layer 258 and the semiconductor layer 256, thereby reducing the carrier concentration of the semiconductor layer 256.

For example, in the case where an insulating layer containing gallium oxide is formed as the insulating layer 258, oxygen is supplied to the insulating layer, so that the composition of gallium oxide can be $GaO_x$.

Alternatively, in the case where an insulating layer containing aluminum oxide is formed as the insulating layer 258, oxygen is supplied to the insulating layer, so that the composition of aluminum oxide can be $AlO_x$.

Alternatively, in the case where an insulating layer containing gallium aluminum oxide or aluminum gallium oxide is formed as the insulating layer 258, oxygen is supplied to the insulating layer, so that the composition of gallium aluminum oxide or aluminum gallium oxide can be $Ga_xAl_{2-x}O_{3+\alpha}$.

Through the steps, an impurity such as hydrogen, moisture, a hydroxyl group, or hydride (also referred to as a hydrogen compound) is removed from the semiconductor layer 256 and oxygen is supplied to the semiconductor layer 256. Thus, the semiconductor layer 256 can be highly purified.

Figure 6C:
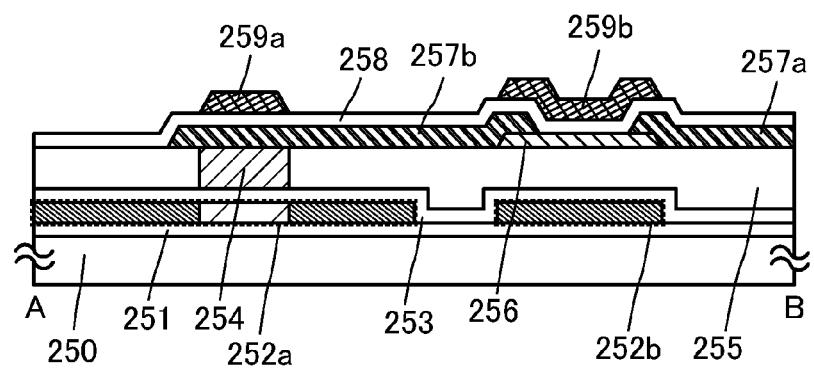

Then, as illustrated in FIG. 6C, a third conductive film is formed over the insulating layer 258 and is partly etched so that the conductive layer 259a and the conductive layer 259b are formed.

For example, the third conductive film can be formed by formation of a film formed using a material that can be used for the conductive layer 259a and the conductive layer 259b by sputtering. Alternatively, the third conductive film can be a stack of films formed using materials that can be used for the conductive layer 259a and the conductive layer 259b.

Figure 7A:
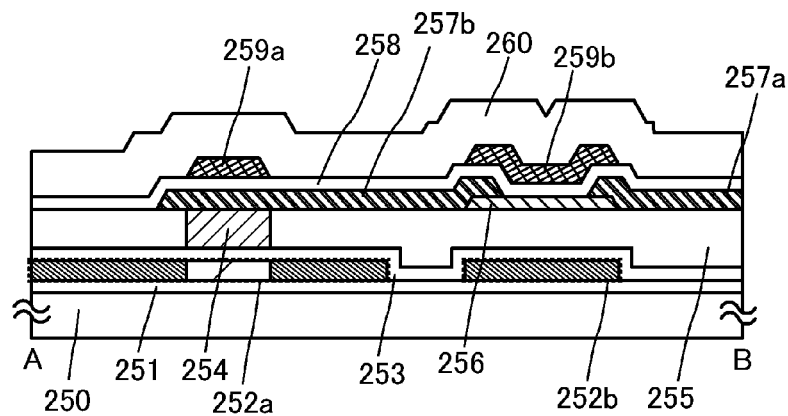
FIGS. 7A to 7C are cross-sectional views illustrating the example of a method for manufacturing the memory cell in FIGS. 3A and 3B.

Next, as illustrated in FIG. 7A, the insulating layer 260 is formed by formation of a fifth insulating film over the insulating layer 258, the conductive layer 259a, and the conductive layer 259b.

For example, the fifth insulating film can be formed by formation of a film formed using a material that can be used for the insulating layer 260 by sputtering, plasma-enhanced CVD, or the like.

Figure 7B:
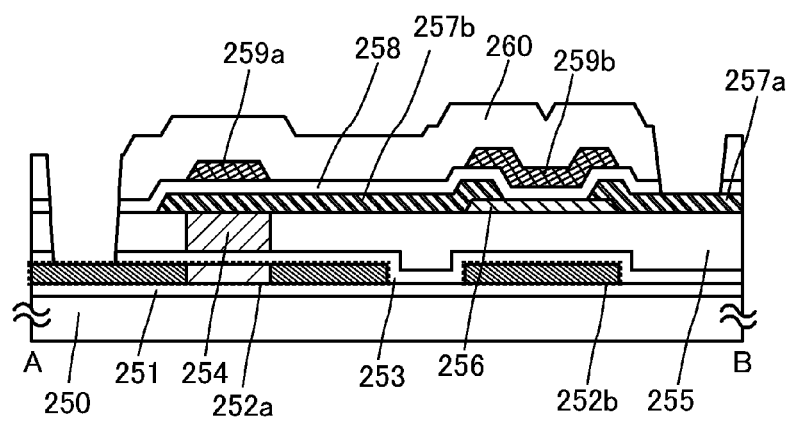

Then, as illustrated in FIG. 7B, the insulating layer 253, the insulating layer 255, the insulating layer 258, and the insulating layer 260 are partly etched so that a first opening reaching the semiconductor layer 252a is formed, and the insulating layer 258 and the insulating layer 260 are partly etched so that a second opening reaching the conductive layer 257a is formed.

Figure 7C:
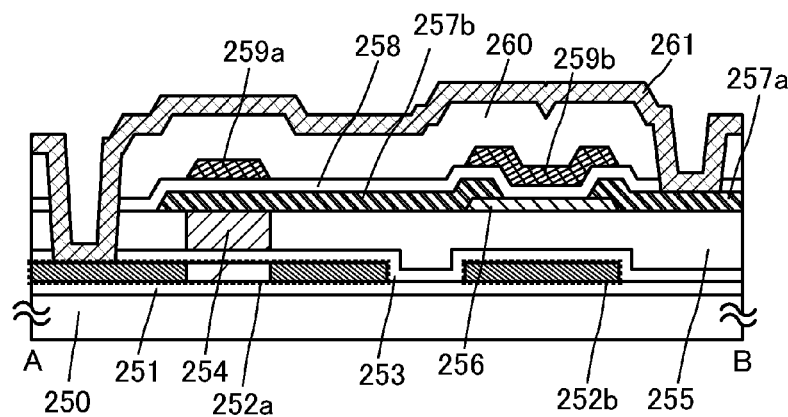

Next, as illustrated in FIG. 7C, the conductive layer 261 is formed in such a manner that a fourth conductive film is formed over the insulating layer 260 to be in contact with the impurity region in the semiconductor layer 252a through the first opening and in contact with the conductive layer 257a through the second opening.

For example, the fourth conductive film can be formed by formation of a film formed using a material that can be used for the conductive layer 261 by sputtering or the like. Alternatively, the fourth conductive film can be a stack of films formed using materials that can be used for the conductive layer 261. The above is the example of the method for manufacturing the memory cell in FIGS. 3A and 3B.

As described with reference to FIGS. 2A and 2B, FIGS. 3A and 3B, FIGS. 4A to 4D, FIGS. 5A to 5D, FIGS. 6A to 6C, and FIGS. 7A to 7C, the example of the semiconductor memory device in this embodiment has a memory cell array including a plurality of memory cells.

The memory cell in the example of the semiconductor memory device in this embodiment includes at least the selection transistor and the output transistor that are field-effect transistors and the storage capacitor.

The selection transistor includes an oxide semiconductor layer in which a channel is formed. The oxide semiconductor layer in which a channel is formed is an oxide semiconductor layer which is made to be intrinsic (i-type) or substantially intrinsic (substantially i-type) by purification. By purification of the oxide semiconductor layer, the carrier concentration in the oxide semiconductor layer can be lower than $1\times10^{14}/cm^3$, preferably lower than $1\times10^{12}/cm^3$, more preferably lower than $1\times10^{11}/cm^3$, so that changes in characteristics due to temperature change can be suppressed. Further, with the above structure, off-state current per micrometer of channel width can be 10 aA ($1\times10^{-17}$ A) or less, 1 aA ($1\times10^{-18}$ A) or less, 10 zA ($1\times10^{-20}$ A) or less, 1 zA ($1\times10^{-21}$ A) or less, or 100 yA ($1\times10^{-22}$ A) or less. It is preferable that the off-state current of the transistor be as low as possible. The lower limit of the off-state current per micrometer of channel width of the transistor in this embodiment is estimated at about $10^{-30}$ A/μm.

In addition, the concentration of an alkali metal contained in the oxide semiconductor layer in which a channel is formed is preferably low. For example, in the case where sodium is contained in the oxide semiconductor layer in which a channel is formed, the concentration of sodium contained in the oxide semiconductor layer in which a channel is formed is $5\times10^{16}/cm^3$ or lower, preferably $1\times10^{16}/cm^3$ or lower, more preferably $1\times10^{15}/cm^3$ or lower. For example, in the case where lithium is contained in the oxide semiconductor layer in which a channel is formed, the concentration of lithium contained in the oxide semiconductor layer in which a channel is formed is $5\times10^{15}/cm^3$ or lower, preferably $1\times10^{15}/cm^3$ or lower. For example, in the case where potassium is contained in the oxide semiconductor layer in which a channel is formed, the concentration of potassium contained in the oxide semiconductor layer in which a channel is formed is $5\times10^{15}/cm^3$ or lower, preferably $1\times10^{15}/cm^3$ or lower. For example, in the case where an insulating layer which is in contact with the oxide semiconductor layer is an oxide, sodium diffuses into the oxide insulating layer and causes deterioration of a transistor (e.g., a shift in threshold voltage or a decrease in mobility). Further, sodium also causes variation of characteristics of plural transistors. Thus, the decrease in the concentration of an alkali metal contained in the oxide semiconductor layer in which a channel is formed leads to suppression of deterioration of transistor characteristics due to the alkali metal.

Further, in the memory cell in the example of the semiconductor memory device in this embodiment, the selection transistor includes the first gate and the second gate.

Further, the memory cell in the example of the semiconductor memory device in this embodiment includes the conductive layer that serves as the second gate of the selection transistor, is apart from the semiconductor layer serving as the channel formation layer of the output transistor, and is formed using the same material as the semiconductor layer.

With the above structure, the threshold voltage of the selection transistor is adjusted as necessary so that the amount of current flowing between the source and the drain of the selection transistor in an off state can be reduced as much as possible. Thus, a data retention period in the memory cell can be lengthened.

In addition, with the above structure, voltage necessary for writing and reading data can be made lower than that of a conventional semiconductor memory device; thus, power consumption can be reduced.

Further, with the above structure, data can be written by input of a data signal to a gate of the output transistor; thus, data writable frequency can be increased.

Furthermore, with the above structure, the semiconductor layer serving as the channel formation layer of the output transistor and the conductive layer serving as the second gate of the selection transistor can be formed concurrently with the use of the layer of the same material in the same step. Thus, the increase in the number of manufacturing steps and the increase in manufacturing cost can be suppressed.

Embodiment 3

In this embodiment, an example of a NAND-type semiconductor memory device is described as an example of the semiconductor device in the above embodiment.

An example of a semiconductor memory device in this embodiment includes a memory cell array including a plurality of memory cells arranged in matrix of I rows (I is a natural number of 2 or more) and J columns (J is a natural number). The memory cell corresponds to the memory circuit in the semiconductor memory device in the above embodiment.

An example of the memory cell array in the semiconductor memory device in this embodiment is described with reference to FIGS. 8A and 8B.

First, an example of the circuit structure of the memory cell array in the semiconductor memory device in this embodiment is described with reference to FIG. 8A.

Figure 8A:
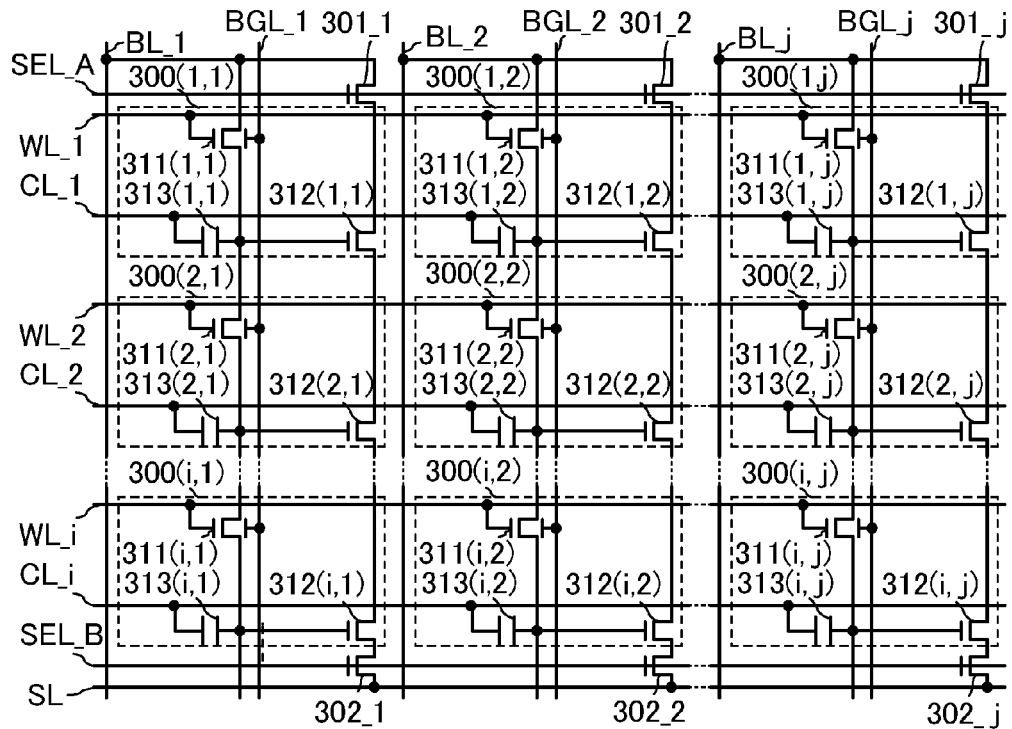
FIGS. 8A and 8B illustrate an example of an explanation of a memory cell array in a semiconductor memory device in Embodiment 3.

The memory cell array illustrated in FIG. 8A includes a plurality of memory cells 300 that are arranged in matrix of i rows (i is a natural number of 3 or more) and j columns (j is a natural number of 3 or more), i word lines WL (word lines WL_1 to WL_i), i capacitor lines CL (capacitor lines CL_1 to CL_i), j gate lines BGL (gate lines BGL_1 to BGL_j), j bit lines BL (bit lines BL_1 to BL_j), a source signal line SL, a selection line SEL_A, a selection line SEL_B, j transistors 301 (transistors 301_1 to 301_j), and j transistors 302 (transistors 302_1 to 302_j). Note that in the semiconductor memory device in this embodiment, the selection line SEL_A, the selection line SEL_B, the i transistors 301, and the i transistors 302 are not necessarily provided.

One of a source and a drain of the transistor 301_N (N is a natural number of j or less) is connected to the bit line BL_N, and a gate of the transistor 301_N is connected to the selection line SEL_A.

The memory cell 300 in an M-th row (M is a natural number of i or less) and an N-th column (such a memory cell is referred to as a memory cell 300 (M, N)) includes a transistor 311 (M, N), a capacitor 313 (M, N), and a transistor 312 (M, N).

The transistor 311 (M, N) is an n-channel transistor, which includes a source, a drain, a first gate, and a second gate.

The first gate of the transistor 311 (M, N) is connected to the word line WL_M. The second gate of the transistor 311 (M, N) is connected to the gate line BGL_N.

In the memory cells 300 in a first row (the memory cells 300 (1, 1) to 300 (i, 1)), one of a source and a drain of the transistor 311 (1, N) is connected to the bit line BL_N.

In the memory cells 300 in a K-th row (K is a natural number of 2 or more and (i−1) or less) (the memory cells 300 (K, 1) to 300 (K, j)), one of a source and a drain of the transistor 311 is connected to the other of the source and the drain of the transistor 311 in memory cells in a (K−1)th row (the memory cells 300 (K−1, 1) to 300 (K−1, j)).

In the memory cells 300 in the i-th row (the memory cells 300 (i, 1) to 300 (i, j)), one of the source and the drain of the transistor 311 is connected to the other of the source and the drain of the transistor 311 in memory cells in an (i−1)th row (the memory cells 300 (i−1, 1) to 300 (i−1, j)).

The transistor 311 (M, N) serves as a selection transistor in the memory cell 300 (M, N). Note that in the semiconductor memory device in this embodiment, the transistor 311 does not always need to be an n-channel transistor.

As the transistor 311 (M, N), a transistor including an oxide semiconductor layer that can be used as the transistor 111 in the semiconductor device in Embodiment 1 can be used, for example.

The transistor 312 (M, N) is an n-channel transistor. Note that in the semiconductor memory device in this embodiment, the transistor 312 does not always need to be an n-channel transistor.

A gate of the transistor 312 (M, N) is connected to the other of the source and the drain of the transistor 311 (M, N).

In the memory cells 300 in the first row (the memory cells 300 (1, 1) to 300 ($i$, 1)), one of a source and a drain of the transistor 312 (1, N) is connected to the other of the source and the drain of the transistor 301_N.

In the memory cells 300 in the K-th row (the memory cells 300 (K, 1) to 300 (K, j)), one of a source and a drain of the transistor 312 is connected to the other of the source and the drain of the transistor 312 in memory cells in the (K−1)th row (the memory cells 300 (K−1, 1) to 300 (K−1, j)).

In the memory cells 300 in the i-th row (the memory cells 300 ($i$, 1) to 300 ($i$, $j$)), one of the source and the drain of the transistor 312 is connected to the other of the source and the drain of the transistor 312 in memory cells in the (i−1)th row (the memory cells 300 ($i$−1, 1) to 300 ($i$−1, j)).

The transistor 312 (M, N) serves as an output transistor in the memory cell 300 (M, N).

As the transistor 312 (M, N), a transistor including a semiconductor layer containing a semiconductor belonging to Group 14 (e.g., silicon) that can be used as the transistor 112 in the semiconductor device in Embodiment 1 can be used.

A first capacitor electrode of the capacitor 313 (M, N) is connected to the capacitor line CL_M. A second capacitor electrode of the capacitor 313 (M, N) is connected to the other of the source and the drain of the transistor 311 (M, N).

The capacitor 313 (M, N) serves as a storage capacitor.

One of a source and a drain of the transistor 302_N is connected to the other of the source and the drain of the transistor 312 ($i$, N) in the memory cells 300 in the i-th row (the memory cells 300 ($i$, 1) to 300 ($i$, $j$)). The other of the source and the drain of the transistor 302_N is connected to the source line SL.

The voltage of the word lines WL_1 to WL_i is controlled by, for example, a driver circuit including a decoder.

The voltage of the bit lines BL_1 to BL_j is controlled by, for example, a driver circuit including a decoder.

The voltage of the capacitor lines CL_1 to CL_i is controlled by, for example, a driver circuit including a decoder.

The voltage of the gate lines BGL_1 to BGL_j is controlled by, for example, a gate line driver circuit.

The gate line driver circuit is formed using, for example, a circuit that includes a diode and a capacitor. In that case, a first capacitor electrode of the capacitor is electrically connected to an anode of the diode and the gate line BGL.

Further, an example of a method for driving the memory cell array in FIG. 8A is described with reference to FIG. 8B. FIG. 8B is a timing chart illustrating an example of a method for driving the memory cell array in FIG. 8A. Here, the case where data is written to the memory cell 300 (1, 1) in the first row and the first column and the memory cell 300 (2, 2) in the second row and a second column and then the data written is read is described as an example. Note that in the timing chart in FIG. 8B, the voltage Vh is higher than the threshold voltage of the transistor 311.

Figure 8B:
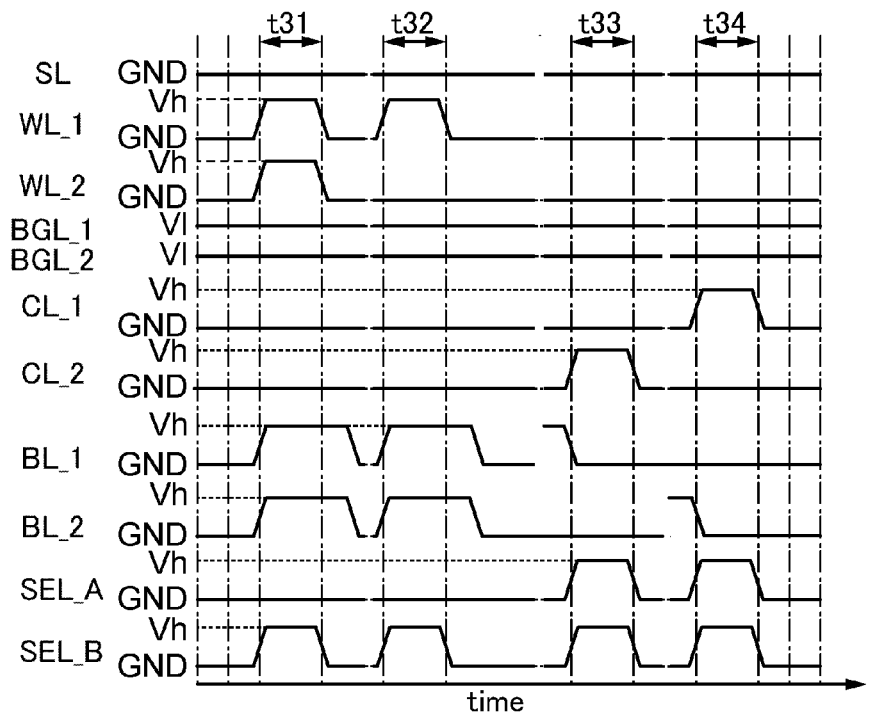

First, as illustrated by a period t31 in FIG. 8B, the voltage of the word lines WL_1 and word line WL_2 is set to the voltage Vh, the voltage of the selection line SEL_A is set equal to the ground potential GND that is a reference potential, and the voltage of the selection line SEL_B is set to the voltage Vh. At this time, the voltage of the word lines WL other than the word line WL_1 and word line WL_2 is set equal to the ground potential GND, and the voltage of the capacitor lines CL_1 to CL_i is set equal to the ground potential GND. Further, the voltage of the source line SL is set equal to the ground potential GND.

At this time, the transistors 311 (1, 1) to 311 (1, $j$) are turned on in the memory cells 300 in the first row (the memory cells 300 (1, 1) to 300 (1, $j$)), and the transistors 311 (2, 1) to 311 (2, $j$) are turned on in the memory cells 300 in the second row (the memory cells 300 (2, 1) to 300 (2, $j$)).

When the transistors 311 (1, 1) to 311 (1, $j$) and the transistors 311 (2, 1) to 311 (2, $j$) are on, a memory data signal is input from the bit line BL_2 to the gate of the transistor 312 (2, 2) and a second capacitor electrode of the capacitor 313 (2, 2) through the transistor 311 (1, 2) and the transistor 311 (2, 2). At this time, the voltage of the gate of the transistor 312 (2, 2) and the voltage of the second capacitor electrode of the capacitor 313 (2, 2) have the same level as the voltage of the memory data signal input, and the memory cell 300 (2, 2) in the second row and the second column is set to be in a write state. Here, the voltage of the bit line BL_2 is the voltage Vh, as an example.

After data is written to the memory cells 300 in the second row (including the memory cell 300 (2, 2) in the second row and the second column), the voltage of the word line WL_2 is set equal to the ground potential GND. At this time, the voltage of the word lines WL_3 to WL_i is equal to the ground potential GND, and the voltage of the capacitor lines CL_1 to CL_i is equal to the ground potential GND. In addition, the voltage of the gate line BGL_2 in the second row is set to V1.

At this time, the transistors 311 (2, 1) to 311 (2, $j$) are turned off. In addition, the threshold voltage of the transistors 311 (2, 1) to 311 (2, $j$) has a positive level. Thus, the voltage of second capacitor electrodes of the capacitors 313 (2, 1) to 313 (2, $j$) and the voltage of gates of the transistors 312 (2, 1) to 312 (2, $j$) are held for a certain period.

Next, as illustrated by a period t32 in FIG. 8B, the voltage of the word line WL_1 is set to the voltage Vh. At this time, the voltage of the word lines WL other than the word line WL_1 and the voltage of the capacitor lines CL_1 to CL_i are set equal to the ground potential GND.

At this time, in the memory cells 300 in the first row (the memory cells 300 (1, 1) to 300 (1, $j$)), the transistors 311 (1, 1) to 311 (1, $j$) are turned on.

When the transistors 311 (1, 1) to 311 (1, $j$) are on, a memory data signal is input from the bit line BL_1 to the gate of the transistor 312 (1, 1) and a second capacitor electrode of the capacitor 313 (1, 1) through the transistor 311 (1, 1). At this time, the voltage of the gate of the transistor 312 (1, 1) and the voltage of the second capacitor electrode of the capacitor 313 (1, 1) have the same level as the voltage of the memory data signal input, and the memory cell 300 (1, 1) in the first row and the first column is set to be in a write state. Here, the voltage of the bit line BL_1 in the first row is the voltage Vh, as an example.

After data is written to the memory cells 300 in the first row (including the memory cell 300 (1, 1) in the first row and the first column), the voltage of the word line WL_1 is set equal to the ground potential GND. At this time, the voltage of the word lines WL other than the word line WL_1 is equal to the ground potential GND, and the voltage of the capacitor lines CL_1 to CL_i is equal to the ground potential GND. In addition, the voltage of the gate line BGL_1 in the first row is set to the voltage V1.

At this time, the transistors 311 (1, 1) to 311 (1, j) are turned off. In addition, the threshold voltage of the transistors 311 (1, 1) to 311 (1, j) has a positive level. Thus, the voltage of second capacitor electrodes of the capacitors 313 (1, 1) to 313 (1, j) and the voltage of gates of the transistors 312 (1, 1) to 312 (1, j) are held for a certain period.

Further, as illustrated by a period t33 in FIG. 8B, the voltage of the capacitor line CL_1 is set equal to the ground potential GND, the voltage of the selection line SEL_A is set to the voltage Vh, and the voltage of the selection line SEL_B is set to the voltage Vh. At this time, the voltage of the word lines WL_1 to WL_i is set equal to the ground potential GND, and the voltage of the capacitor lines CL other than the capacitor line CL_1 is set to the voltage Vh. Further, the voltage of the source line SL is equal to the ground potential GND. Note that before the period t33, the voltage of the bit line BL_1 is set to the voltage Vh.

At this time, in each of the memory cells 300 (1, 1) to (i, 1), resistance between a source and a drain of the transistor 312 is based on the voltage of the gate of the transistor 312. Further, in each of the memory cells 300 (1, 1) to (i, 1), when the transistor 312 is turned on, the voltage of the bit line BL_1 is set equal to the ground potential GND, the voltage of the bit line BL_1 is output as data, and the data is read.

Next, as illustrated by a period t34 in FIG. 8B, the voltage of the capacitor line CL_2 is set equal to the ground potential GND, the voltage of the selection line SEL_A is set to the voltage Vh, and the voltage of the selection line SEL_B is set to the voltage Vh. At this time, the voltage of the word lines WL_1 to WL_i is set equal to the ground potential GND, and the voltage of the capacitor lines CL other than the capacitor line CL_2 is set to the voltage Vh. Further, the voltage of the source line SL is equal to the ground potential GND. Note that before the period t34, the voltage of the bit line BL_2 is set to the voltage Vh.

At this time, in each of the memory cells 300 (1, 2) to (i, 2), resistance between a source and a drain of the transistor 312 is based on the voltage of the gate of the transistor 312. Further, in each of the memory cells 300 (1, 2) to (i, 2), when the transistor 312 is turned on, the voltage of the bit line BL_2 is set equal to the ground potential GND, the voltage of the bit line BL_2 is output as data, and the data is read. The above is the example of the method for driving the memory cell array in FIG. 8A.

Figure 9A:
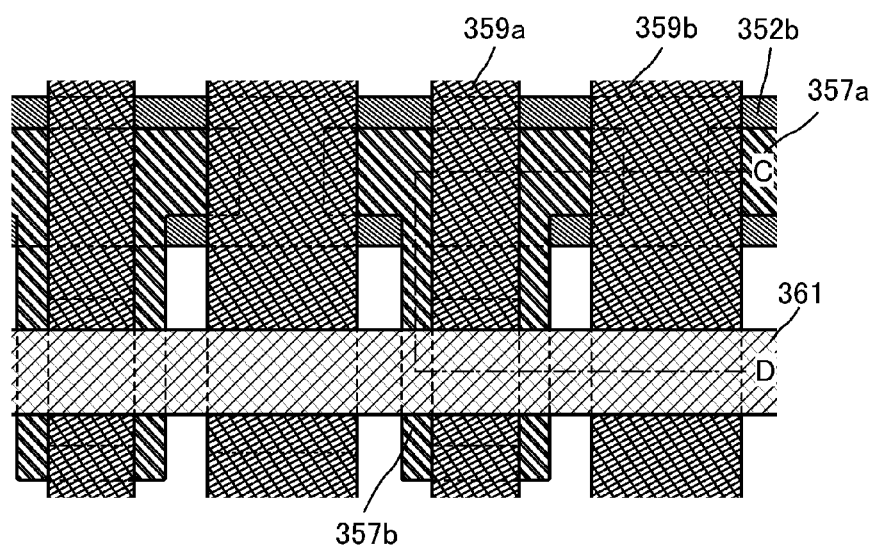
FIGS. 9A and 9B illustrate a structure example of a memory cell in the semiconductor memory device in Embodiment 3.
Figure 9B:
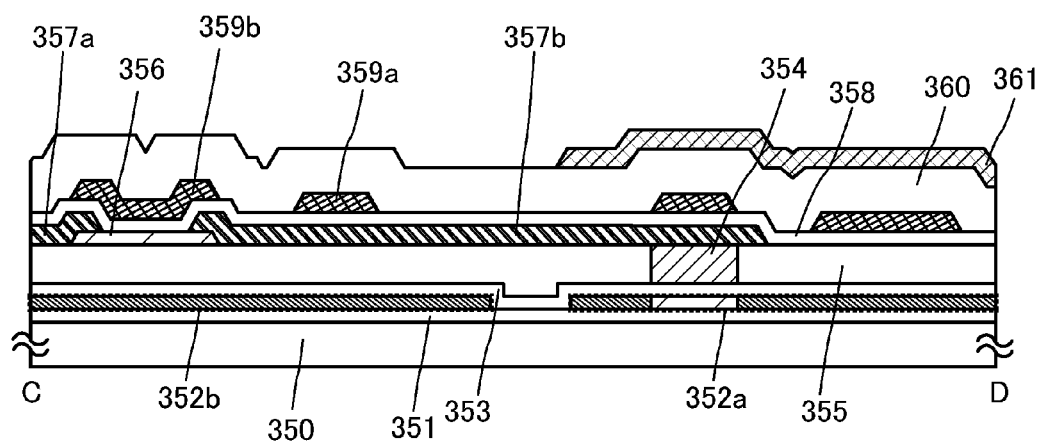

Next, a structure example of the memory cell 300 in the memory cell array in FIG. 8A is described with reference to FIGS. 9A and 9B. FIGS. 9A and 9B illustrate a structure example of a memory cell in the semiconductor memory device in this embodiment. FIG. 9A is a top view and FIG. 9B is a cross-sectional view along line C-D in FIG. 9A. Note that FIGS. 9A and 9B illustrate a structure example of two memory cells.

The memory cell illustrated in FIGS. 9A and 9B includes a semiconductor layer 352a, a semiconductor layer 352b, an insulating layer 353, a conductive layer 354, an insulating layer 355, a semiconductor layer 356, a conductive layer 357a, a conductive layer 357b, an insulating layer 358, a conductive layer 359a, a conductive layer 359b, an insulating layer 360, and a conductive layer 361. Note that the semiconductor memory device in this embodiment does not necessarily include the insulating layer 355.

Each of the semiconductor layers 352a and 352b is formed over one surface of a substrate 350 with an insulating layer 351 provided therebetween.

As the substrate 350, a substrate which can be used as the substrate 150 in Embodiment 1 can be used.

As the insulating layer 351, a layer formed using a material that can be used for the insulating layer 251 in Embodiment 2 can be used. Note that the insulating layer 351 can be a stack of layers formed using materials that can be used for the insulating layer 351.

The semiconductor layer 352a has a pair of impurity regions. The semiconductor layer 352a has a channel formation region between the pair of impurity regions. A plurality of impurity regions with different concentrations of impurity elements may be provided in the semiconductor layer 352a.

In addition, in the memory cells arranged in the same row, the semiconductor layers 352a are formed using the same layer.

The semiconductor layer 352a serves as a channel formation layer of a transistor that serves as an output transistor in a source line and each memory cell.

The semiconductor layer 352b contains the same impurity element as the impurity region in the semiconductor layer 352a. The semiconductor layer 352b is apart from the semiconductor layer 352a. Note that the semiconductor layer 352b contains impurity elements imparting conductivity such that it can serve as a conductive layer and thus can be regarded as a conductive layer.

The semiconductor layer 352b serves as a second gate of a transistor that serves as a selection transistor in the gate line BGL and each memory cell.

As the semiconductor layer 352a and the semiconductor layer 352b, a layer formed using a material that can be used for the semiconductor layer 152a and the semiconductor layer 152b in Embodiment 1 can be used, for example.

The insulating layer 353 is provided over the semiconductor layer 352a and the semiconductor layer 352b.

The insulating layer 353 serves as a gate insulating layer of a transistor that serves as an output transistor in each memory cell.

As the insulating layer 353, a layer formed using a material that can be used for the insulating layer 151 in Embodiment 1 can be used, for example. Alternatively, the insulating layer 353 can be a stack of layers formed using materials that can be used for the insulating layer 151.

The conductive layer 354 overlaps with the semiconductor layer 352a (including the channel formation region) with the insulating layer 353 provided therebetween. Note that a side surface of the conductive layer 354 may be tapered. When the side surface of the conductive layer 354 is tapered, formation of an upper layer can be facilitated.

The conductive layer 354 serves as a gate of a transistor that serves as an output transistor in the memory cell.

As the conductive layer 354, a layer formed using a material that can be used for the conductive layer 154 in Embodiment 1 can be used. Alternatively, the conductive layer 354 can be a stack of layers formed using materials that can be used for the conductive layer 354.

The insulating layer 355 is provided over the insulating layer 353. With provision of the insulating layer 355, for example, an uneven portion due to the conductive layer 354 can be flattened and formation of a layer in an upper portion is facilitated.

As the insulating layer 355, a layer formed using a material that can be used for the insulating layer 151 in Embodiment 1 can be used, for example. Alternatively, the insulating layer 355 can be a stack of layers formed using materials that can be used for the insulating layer 355. For example, the insulating layer 355 can be formed using a stack of a silicon oxynitride layer, a silicon nitride oxide layer, and a silicon oxide layer.

The semiconductor layer 356 overlaps with the semiconductor layer 352b with the insulating layer 353 and the insulating layer 355 provided therebetween.

The semiconductor layer 356 serves as a channel formation layer of a transistor that serves as a selection transistor in the memory cell.

As the semiconductor layer 356, a layer formed using a material that can be used for the semiconductor layer 156 in Embodiment 1 can be used, for example.

The conductive layer 357a is electrically connected to the semiconductor layer 356.

In the memory cells arranged in the same column, the conductive layer 357a of the memory cell in a k-th row (k is a natural number of 2 or more and I or less) is electrically connected to the semiconductor layer 356 of the memory cell in a (k−1)th row. Thus, the number of wirings can be reduced, so that the area of the semiconductor memory device can be made small. Note that the semiconductor memory device in this embodiment is not necessarily limited to this.

The conductive layer 357a serves as one of a source and a drain of the transistor that serves as the selection transistor in the memory cell.

The conductive layer 357b is electrically connected to the conductive layer 354 and the semiconductor layer 356. With a structure where the conductive layer 357b is in contact with the conductive layer 354, a contact area can be made larger than a contact area at the time when the conductive layer 357b is electrically connected to the conductive layer 354 through an opening in an insulating layer. Thus, contact resistance can be reduced.

The conductive layer 357b serves as the other of the source and the drain of the transistor that serves as the selection transistor in the memory cell and also serves as a second capacitor electrode of a capacitor that serves as a storage capacitor in the memory cell.

As the conductive layer 357a and the conductive layer 357b, a layer formed using a material that can be used for the conductive layer 157a and the conductive layer 157b in Embodiment 1 can be used, for example. Alternatively, the conductive layer 357a and the conductive layer 357b can be a stack of layers formed using materials that can be used for the conductive layer 357a and the conductive layer 357b.

The insulating layer 358 is formed over the semiconductor layer 356, the conductive layer 357a, and the conductive layer 357b.

The insulating layer 358 serves as a gate insulating layer of the transistor that serves as the selection transistor in the memory cell and also serves as a dielectric layer of the capacitor that serves as the storage capacitor in the memory cell.

As the insulating layer 358, an insulating layer formed using a material that can be used for the insulating layer 158 in Embodiment 1 can be used. Alternatively, the insulating layer 358 can be a stack of layers formed using materials that can be used for the insulating layer 158.

The conductive layer 359a overlaps with the conductive layer 357a with the insulating layer 358 provided therebetween.

The conductive layer 359a serves as a first capacitor electrode of the capacitor that serves as the storage capacitor in the memory cell.

The conductive layer 359b overlaps with the semiconductor layer 356 with the insulating layer 358 provided therebetween.

The semiconductor layer 359b serves as a first gate of a transistor that serves as a selection transistor in the word line WL and the memory cell.

As the conductive layer 359a and the conductive layer 359b, a layer formed using a material that can be used for the conductive layer 159 in Embodiment 1 can be used. Alternatively, the conductive layer 359a and the conductive layer 359b can be a stack of layers formed using materials that can be used for the conductive layer 359a and the conductive layer 359b.

The insulating layer 360 is formed over the insulating layer 358, the conductive layer 359a, and the conductive layer 359b.

As the insulating layer 360, a layer formed using a material that can be used for the insulating layer 355 can be used, for example. Alternatively, the insulating layer 360 can be a stack of layers formed using materials that can be used for the insulating layer 360.

The conductive layer 361 is in contact with the conductive layer 357b through an opening formed in the insulating layer 358 and the insulating layer 360 and is in contact with the impurity region in the semiconductor layer 352a through an opening formed in the insulating layer 353, the insulating layer 355, the insulating layer 358, and the insulating layer 360.

The conductive layer 361 serves as the bit line BL in the memory cell.

As the conductive layer 361, a layer formed using a material that can be used for the conductive layer 354 can be used, for example. Alternatively, the conductive layer 361 can be a stack of layers formed using materials that can be used for the conductive layer 361.

An insulating layer may be provided over the conductive layer 361, and a different conductive layer that is electrically connected to the conductive layer 361 through an opening formed in the insulating layer may be provided over the insulating layer.

Note that in the memory cell of the semiconductor memory device in this embodiment, the level of voltage applied to the second gate or the thickness of the insulating layer 355 is set as appropriate so that the level of the threshold voltage of the transistor serving as the selection transistor can be changed into a desired level as necessary.

Next, an example of a method for manufacturing the memory cell in FIGS. 9A and 9B is described with reference to FIGS. 10A to 10D, FIGS. 11A to 11C, FIGS. 12A to 12C, and FIGS. 13A to 13C. FIGS. 10A to 10D, FIGS. 11A to 11C, FIGS. 12A to 12C, and FIGS. 13A to 13C are cross-sectional views illustrating an example of the method for manufacturing the memory cell in FIGS. 9A and 9B.

Figure 10A:
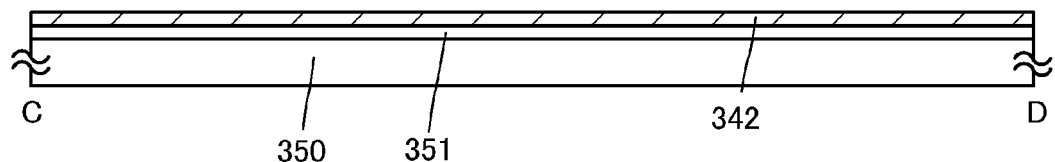
FIGS. 10A to 10D are cross-sectional views illustrating an example of a method for manufacturing the memory cell in FIGS. 9A and 9B.

First, as illustrated in FIG. 10A, the substrate 350 is prepared, the insulating layer 351 is formed over one surface of the substrate 350, and a semiconductor layer 342 is formed over the one surface of the substrate 350 with the insulating layer 351 provided therebetween. Note that an oxide insulating layer or a nitride insulating layer may be formed over the substrate 350 in advance.

For example, the insulating layer 351 and the semiconductor layer 342 can be formed over the substrate 350 by a method that is the same as the method for forming the insulating layer 251 and the semiconductor layer 242 over one surface of the substrate 250 in Embodiment 2.

Note that after the semiconductor layer 342 is formed, an impurity element imparting p-type or n-type conductivity may be added to the semiconductor layer 342. By addition of the impurity element imparting p-type or n-type conductivity to the semiconductor layer 342, the threshold voltage of the transistor including the semiconductor layer 342 can be easily controlled.

Without limitation to the above formation method, the semiconductor layer 342 may be formed by formation of a polycrystalline, microcrystalline, or amorphous semiconductor layer over the insulating layer 351 by CVD.

Figure 10B:
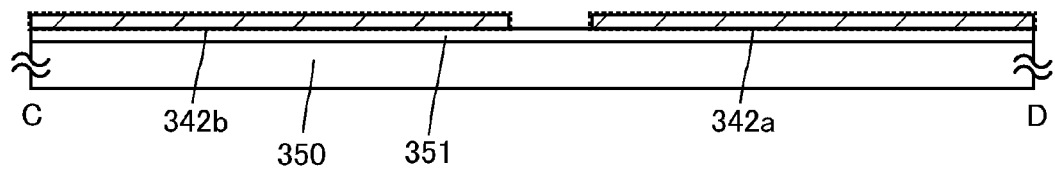

Next, as illustrated in FIG. 10B, by etching of part of the semiconductor layer 342, a semiconductor layer 342a and a semiconductor layer 342b which are apart from each other are formed.

Figure 10C:
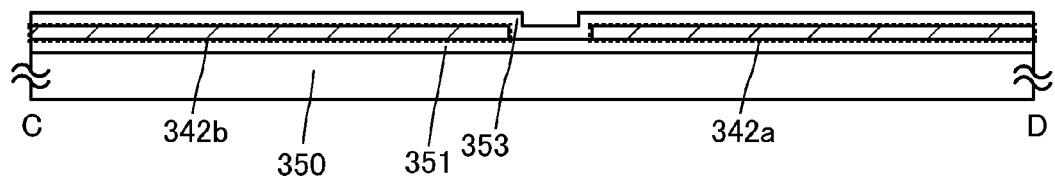

Next, as illustrated in FIG. 10C, the insulating layer 353 is formed over the semiconductor layer 342a and the semiconductor layer 342b.

For example, the insulating layer 353 can be formed by formation of a film formed using a material that can be used for the insulating layer 353 by a method similar to the method for forming the film that can be used for the insulating layer 253. Alternatively, the insulating layer 353 can be a stack of layers formed using materials that can be used for the insulating layer 353.

Note that after the insulating layer 353 is formed, an impurity element imparting p-type or n-type conductivity may be added to part of the semiconductor layer 342a and part of the semiconductor layer 342b.

Figure 10D:
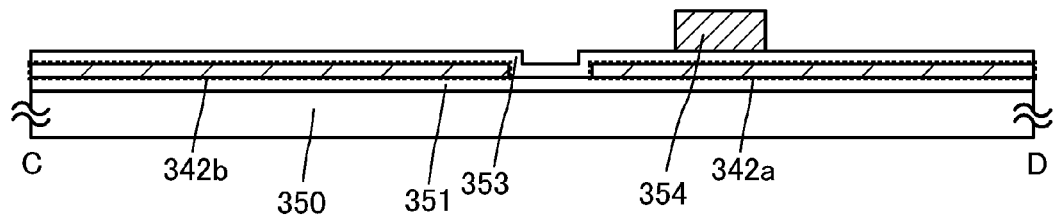

Then, as illustrated in FIG. 10D, a first conductive film is formed over at least part of the semiconductor layer 342a with the insulating layer 353 provided therebetween and is partly etched so that the conductive layer 354 is formed.

For example, the first conductive film can be formed by formation of a film formed using a material that can be used for the conductive layer 354 by sputtering. Alternatively, the first conductive film can be a stack of films formed using materials that can be used for the first conductive film.

Figure 11A:
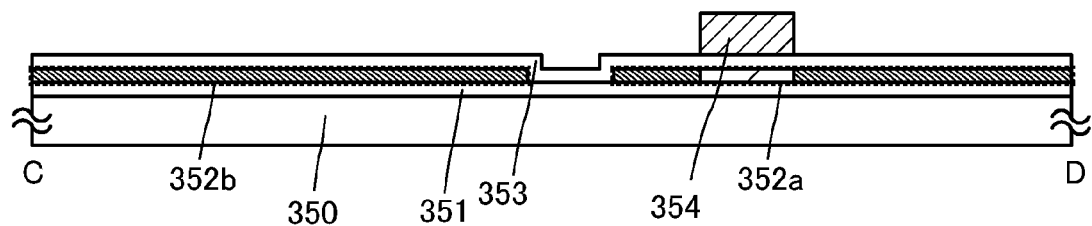
FIGS. 11A to 11C are cross-sectional views illustrating the example of a method for manufacturing the memory cell in FIGS. 9A and 9B.

Next, as illustrated in FIG. 11A, an impurity element imparting p-type or n-type conductivity is added to the semiconductor layer 342a and the semiconductor layer 342b with the use of the conductive layer 354 as a mask so that a channel formation region is formed to overlap with the conductive layer 354 in the semiconductor layer 342a, impurity regions are formed in a region other than that region, and an impurity region is formed in the semiconductor layer 342b so that the semiconductor layer 352a and the semiconductor layer 352b are formed.

Figure 11B:
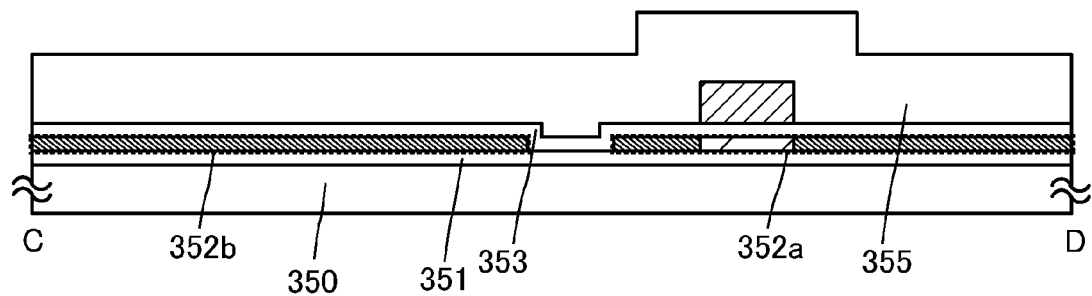

Next, as illustrated in FIG. 11B, the insulating layer 355 is formed by formation of a third insulating film over the insulating layer 353 and the conductive layer 354.

For example, the insulating layer 355 can be formed in such a manner that a silicon oxynitride film is formed over the insulating layer 353 and the conductive layer 354, a silicon nitride oxide film is formed over the silicon oxynitride film, and a silicon oxide film is formed over the silicon nitride oxide film.

Figure 11C:
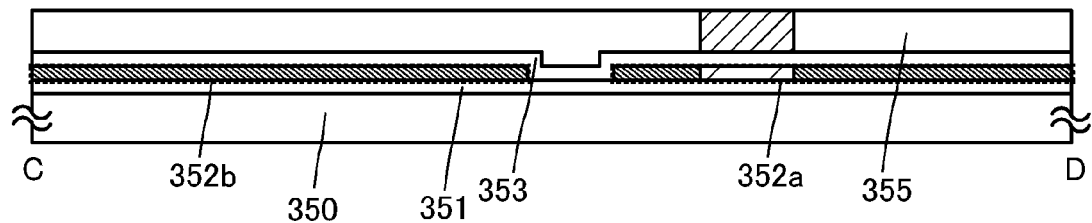

Then, as illustrated in FIG. 11C, an upper surface of the conductive layer 354 is exposed by removal of part of the insulating layer 355.

For example, the upper surface of the conductive layer 354 can be exposed by removal of the part of the insulating layer 355 by CMP (chemical mechanical polishing) or etching.

For example, in the case where a silicon oxynitride film, a silicon nitride oxide film, and a silicon oxide film are formed in that order so that the insulating layer 353 is formed, an upper surface of the silicon nitride oxide film may be exposed by CMP and an upper surface of the conductive layer 354 may be exposed by dry etching.

Figure 12A:
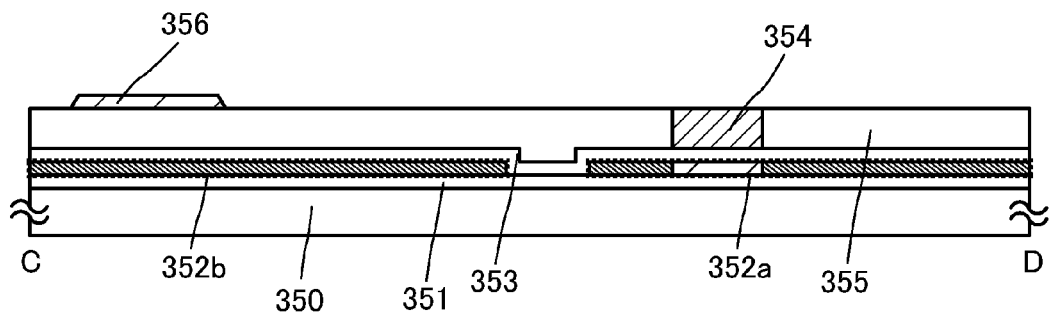
FIGS. 12A to 12C are cross-sectional views illustrating the example of a method for manufacturing the memory cell in FIGS. 9A and 9B.

Then, as illustrated in FIG. 12A, an oxide semiconductor film is formed over the insulating layer 355 and is partly etched so that the semiconductor layer 356 is formed.

For example, the oxide semiconductor film can be formed by formation of a film formed using an oxide semiconductor material that can be used for the semiconductor layer 356 by sputtering. Note that the oxide semiconductor film may be formed in a rare gas atmosphere, an oxygen atmosphere, or a mixed atmosphere of a rare gas and oxygen. For example, by formation of the oxide semiconductor film in an oxygen atmosphere, a high-crystallinity oxide semiconductor film can be formed.

The oxide semiconductor film can be formed using an oxide target having a composition ratio of $In_2O_3$:$Ga_2O_3$:$ZnO$=1:1:1 (in a molar ratio) as a sputtering target. Alternatively, for example, the oxide semiconductor film may be formed using an oxide target having a composition ratio of $In_2O_3$:$Ga_2O_3$:$ZnO$=1:1:2 (in a molar ratio).

The proportion of the volume of a portion except for the area of a space and the like with respect to the total volume of the oxide target (such a proportion is also referred to as relative density) is preferably higher than or equal to 90% and lower than or equal to 100%, more preferably higher than or equal to 95% and lower than or equal to 99.9%.

When the oxide semiconductor film is formed by sputtering, the substrate 350 may be kept under reduced pressure and heated at 100 to 600° C., preferably 300 to 400° C. By heating of the substrate 350, the impurity concentration in the oxide semiconductor film can be lowered and damage to the oxide semiconductor film caused by the sputtering can be reduced.

Figure 12B:
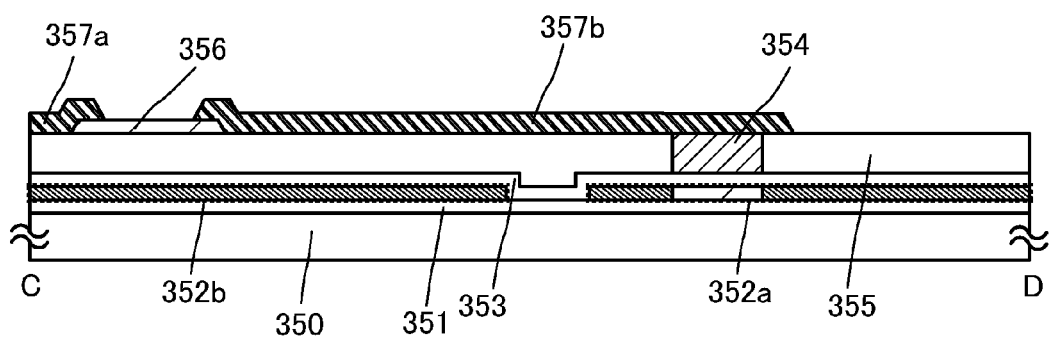

Then, as illustrated in FIG. 12B, a second conductive film is formed over the conductive layer 354, the insulating layer 355, and the semiconductor layer 356 and is partly etched so that the conductive layer 357a and the conductive layer 357b are formed.

For example, the second conductive film can be formed by formation of a film formed using a material that can be used for the conductive layer 357a and the conductive layer 357b by sputtering or the like. Alternatively, the second conductive film can be a stack of films formed using materials that can be used for the conductive layer 357a and the conductive layer 357b.

Figure 12C:
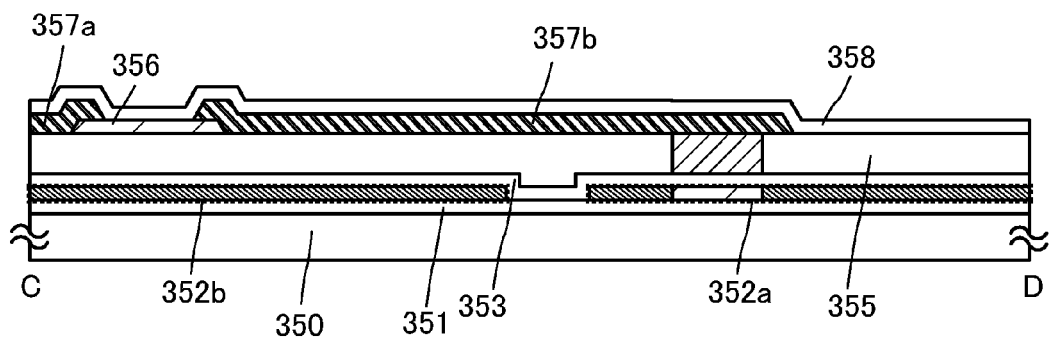

Then, as illustrated in FIG. 12C, the insulating layer 358 is formed to be in contact with the semiconductor layer 356.

Note that heat treatment may be performed at higher than or equal to 400° C. and lower than or equal to 750° C., or higher than or equal to 400° C. and lower than the strain point of the substrate after the oxide semiconductor film is formed, after part of the oxide semiconductor film is etched, after the second conductive film is formed, after part of the second conductive film is etched, or after the insulating layer 358 is formed.

Note that as the heat treatment apparatus used for the heat treatment, a heat treatment apparatus that can be applied to the manufacturing method in Embodiment 2 can be used.

After the heat treatment, a high-purity oxygen gas, a high-purity $N_2O$ gas, or ultra-dry air (with a dew point of −40° C. or lower, preferably −60° C. or lower) may be introduced into the furnace that has been used in the heat treatment while the heating temperature is maintained or decreased. In that case, it is preferable that water, hydrogen, and the like be not contained in the oxygen gas or the $N_2O$ gas. The purity of the oxygen gas or the $N_2O$ gas which is introduced into the heat treatment apparatus is preferably 6N or higher, more preferably 7N or higher. That is, the impurity concentration in the oxygen gas or the $N_2O$ gas is 1 ppm or lower, preferably 0.1 ppm or lower. By the action of the oxygen gas or the $N_2O$ gas, oxygen is supplied to the semiconductor layer 356, so that defects caused by oxygen deficiency in the semiconductor layer 356 can be reduced.

Further, in addition to the heat treatment, after the insulating layer 358 is formed, heat treatment (preferably at 300 to 400° C., for example, 300 to 350° C.) may be performed in an inert gas atmosphere or an oxygen gas atmosphere.

Further, oxygen doping treatment using oxygen plasma may be performed after the formation of the insulating layer 358, after the formation of the oxide semiconductor film, after the formation of the conductive layer serving as the source or the drain of the transistor that serves as the selection transistor, after the formation of the insulating layer, or after the heat treatment. For example, oxygen doping treatment may be performed using a high-density plasma of 2.45 GHz. Alternatively, the oxygen doping treatment may be performed by ion implantation or ion doping.

For example, in the case where an insulating layer containing gallium oxide is formed as the insulating layer 358, oxygen is supplied to the insulating layer, so that the composition of gallium oxide can be $GaO_x$.

Alternatively, in the case where an insulating layer containing aluminum oxide is formed as the insulating layer 358, oxygen is supplied to the insulating layer, so that the composition of aluminum oxide can be $AlO_x$.

Alternatively, in the case where an insulating layer containing gallium aluminum oxide or aluminum gallium oxide is formed as the insulating layer 358, oxygen is supplied to the insulating layer, so that the composition of gallium aluminum oxide or aluminum gallium oxide can be $Ga_xAl_{2-x}O_{3+\alpha}$.

Through the steps, an impurity such as hydrogen, moisture, a hydroxyl group, or hydride (also referred to as a hydrogen compound) is removed from the semiconductor layer 356 and oxygen is supplied to the semiconductor layer 356. Thus, the semiconductor layer 356 can be highly purified.

Figure 13A:
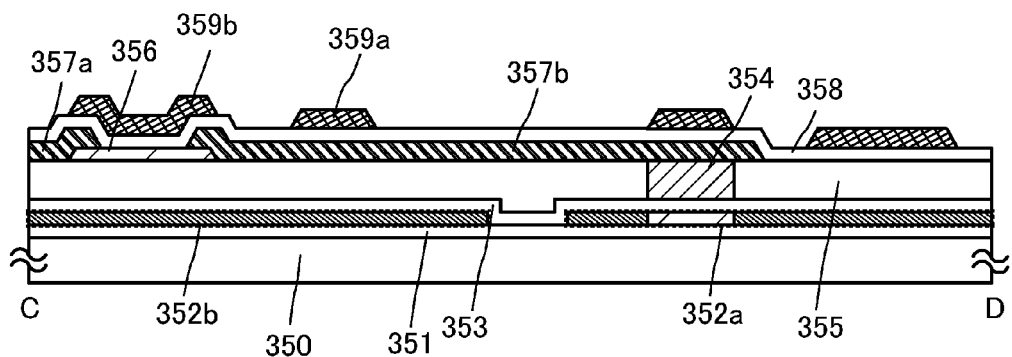
FIGS. 13A to 13C are cross-sectional views illustrating the example of a method for manufacturing the memory cell in FIGS. 9A and 9B.

Then, as illustrated in FIG. 13A, a third conductive film is formed over the insulating layer 358 and is partly etched so that the conductive layer 359a and the conductive layer 359b are formed.

For example, the third conductive film can be formed by formation of a film formed using a material that can be used for the conductive layer 359a and the conductive layer 359b by sputtering. Alternatively, the third conductive film can be a stack of films formed using materials that can be used for the conductive layer 359a and the conductive layer 359b.

Figure 13B:
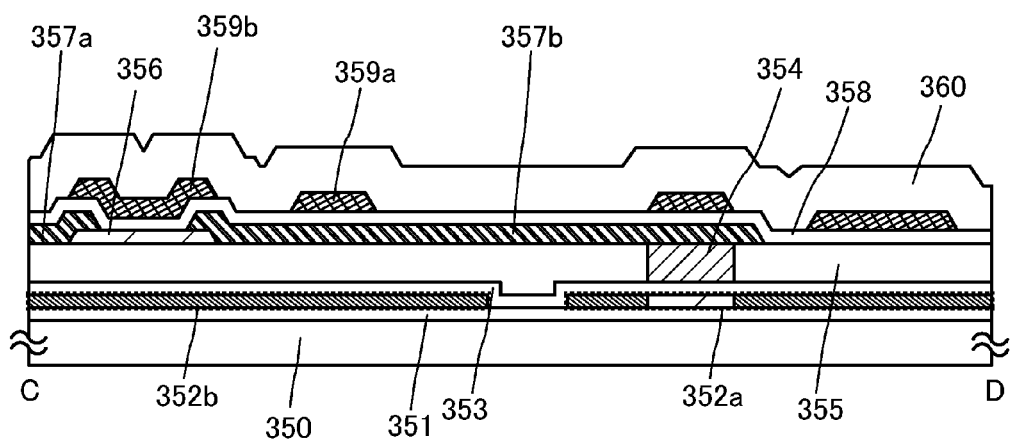

Next, as illustrated in FIG. 13B, the insulating layer 360 is formed by formation of a fifth insulating film over the insulating layer 358, the conductive layer 359a, and the conductive layer 359b.

For example, the fifth insulating film can be formed by formation of a film formed using a material that can be used for the insulating layer 360 by sputtering, plasma-enhanced CVD, or the like.

Figure 13C:
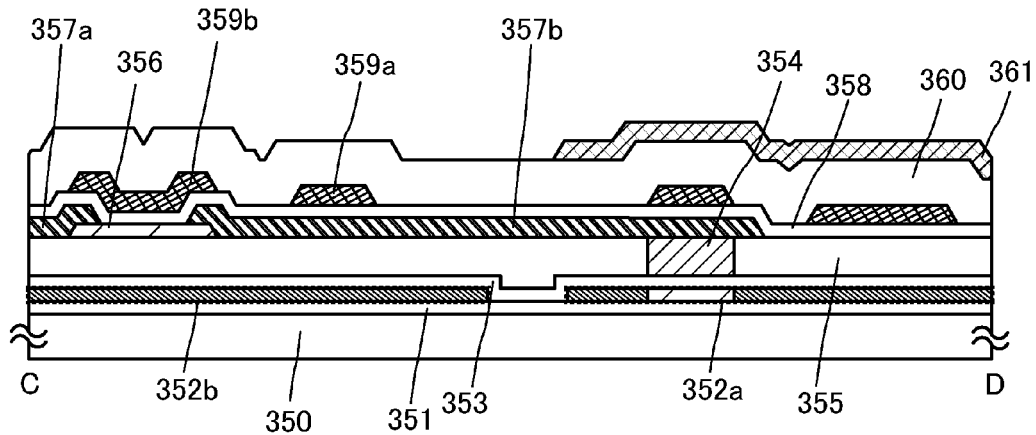

Then, as illustrated in FIG. 13C, the conductive layer 361 is formed over the insulating layer 360. At this time, an opening is provided to be in contact with the conductive layer 361 and the impurity region in the semiconductor layer 352a of the memory cell in the first row and the same column.

For example, a fourth conductive film can be formed by formation of a film formed using a material that can be used for the conductive layer 361 by sputtering or the like. Alternatively, the fourth conductive film can be a stack of films formed using materials that can be used for the conductive layer 361. The above is the example of the method for manufacturing the memory cell in FIGS. 9A and 9B.

As described with reference to FIGS. 8A and 8B, FIGS. 9A and 9B, FIGS. 10A to 10D, FIGS. 11A to 11C, FIGS. 12A to 12C, and FIGS. 13A to 13C, the example of the semiconductor memory device in this embodiment has a memory cell array including a plurality of memory cells.

The memory cell in the example of the semiconductor memory device in this embodiment includes at least the selection transistor and the output transistor that are field-effect transistors and the storage capacitor.

The selection transistor includes an oxide semiconductor layer in which a channel is formed. The oxide semiconductor layer in which a channel is formed is an oxide semiconductor layer which is made to be intrinsic (i-type) or substantially intrinsic (i-type) by purification. By purification of the oxide semiconductor layer, the carrier concentration in the oxide semiconductor layer can be lower than $1\times10^{14}/cm^3$, preferably lower than $1\times10^{12}/cm^3$, more preferably lower than $1\times10^{11}/cm^3$, so that changes in characteristics due to temperature change can be suppressed. Further, with the above structure, off-state current per micrometer of channel width can be 10 aA ($1\times10^{-17}$ A) or less, 1 aA ($1\times10^{-18}$ A) or less, 10 zA ($1\times10^{-30}$ A) or less, 1 zA ($1\times10^{-31}$ A) or less, or 100 yA ($1\times10^{-22}$ A) or less. It is preferable that the off-state current of the transistor be as low as possible. The lower limit of the off-state current per micrometer of channel width of the transistor in this embodiment is estimated at about $10^{-30}$ A/μm.

In addition, the concentration of an alkali metal contained in the oxide semiconductor layer in which a channel is formed is preferably low. For example, in the case where sodium is contained in the oxide semiconductor layer in which a channel is formed, the concentration of sodium contained in the oxide semiconductor layer in which a channel is formed is $5\times10^{16}/cm^3$ or lower, preferably $1\times10^{16}/cm^3$ or lower, more preferably $1\times10^{15}/cm^3$ or lower. For example, in the case where lithium is contained in the oxide semiconductor layer in which a channel is formed, the concentration of lithium contained in the oxide semiconductor layer in which a channel is formed is $5\times10^{15}/cm^3$ or lower, preferably $1\times10^{15}/cm^3$ or lower. For example, in the case where potassium is contained in the oxide semiconductor layer in which a channel is formed, the concentration of potassium contained in the oxide semiconductor layer in which a channel is formed is $5\times10^{15}/cm^3$ or lower, preferably $1\times10^{15}/cm^3$ or lower. For example, in the case where an insulating layer which is in contact with the oxide semiconductor layer is an oxide, sodium diffuses into the oxide insulating layer and causes deterioration of a transistor (e.g., a shift in threshold voltage or a decrease in mobility). Further, sodium also causes variation of characteristics of plural transistors. Thus, the decrease in the concentration of an alkali metal contained in the oxide semiconductor layer in which a channel is formed leads to suppression of deterioration of transistor characteristics due to the alkali metal.

Further, in the memory cell in the example of the semiconductor memory device in this embodiment, the selection transistor includes the first gate and the second gate.

Further, the memory cell in the example of the semiconductor memory device in this embodiment includes the conductive layer that serves as the second gate of the selection transistor, is apart from the semiconductor layer serving as the channel formation layer of the output transistor, and is formed using the same material as the semiconductor layer.

With the above structure, the threshold voltage of the selection transistor is adjusted as necessary so that the amount of current flowing between the source and the drain of the selection transistor in an off state can be reduced as much as possible. Thus, a data retention period in the memory cell can be lengthened.

In addition, with the above structure, voltage necessary for writing and reading data can be made lower than that of a conventional semiconductor memory device; thus, power consumption can be reduced.

Further, with the above structure, data can be written by input of a data signal to a gate of the output transistor; thus, data writable frequency can be increased.

Furthermore, with the above structure, the semiconductor layer serving as the channel formation layer of the output transistor and the conductive layer serving as the second gate of the selection transistor can be formed concurrently with the use of the layer of the same material in the same step. Thus, the increase in the number of manufacturing steps and the increase in manufacturing cost can be suppressed.

Embodiment 4

In this embodiment, a structure example of the gate line driver circuit in the semiconductor memory device in the above embodiment is described.

An example of the circuit structure of a gate line driver circuit in this embodiment is described with reference to FIG. 14.

Figure 14:
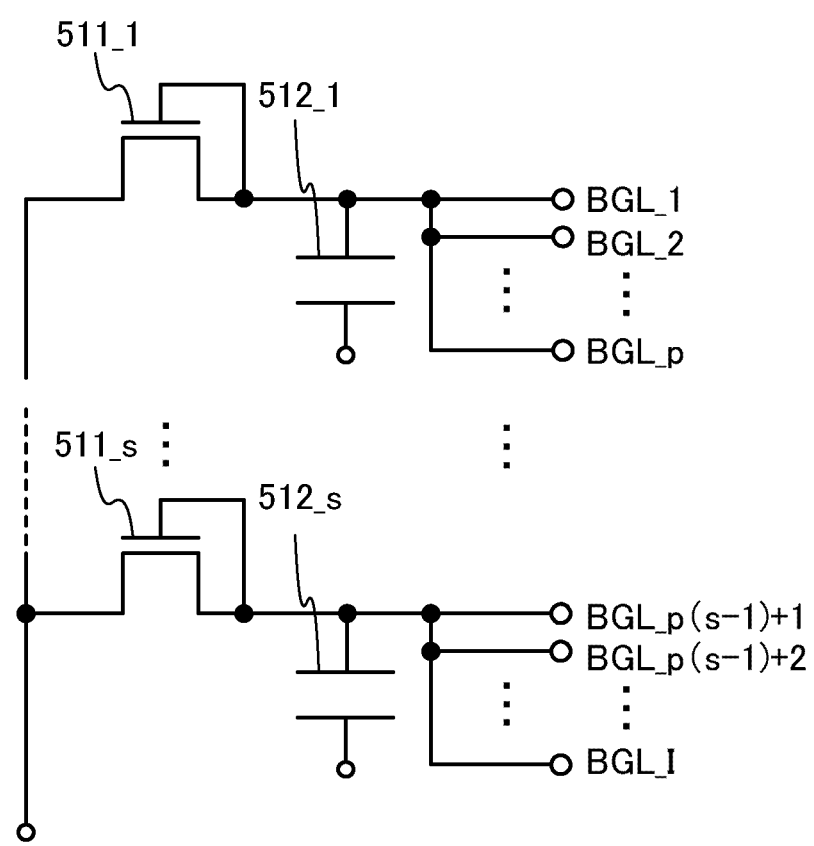
FIG. 14 is a circuit diagram illustrating a structure example of a gate line driver circuit in Embodiment 4.

The gate line driver circuit illustrated in FIG. 14 includes s-stage (s is a natural number of 2 or more and i or less) unit gate line driver circuits.

The unit gate line driver circuit in a z-th stage (z is a natural number of 2 or more and s or less) includes a transistor $511\_z$ and a capacitor $512\_z$.

Voltage VC is selectively input to one of a source and a drain of the transistor $511\_z$. The other of the source and the drain of the transistor $511\_z$ is connected to a gate of the transistor $511\_z$.

The transistor $511\_z$ serves as a diode. In that case, the one of the source and the drain of the transistor $511\_z$ is a cathode, and the other of the source and the drain of the transistor $511\_z$ is an anode.

Note that as the transistor $511\_z$, a transistor that includes a first gate and a second gate can be used. In that case, the other of the source and the drain of the transistor $511\_z$ is connected to the first gate and the second gate of the transistor $511\_z$.

A first capacitor electrode of the capacitor $512\_z$ is connected to the other of the source and the drain of the transistor $511\_z$. The ground potential GND is input to a second capacitor electrode of the capacitor $512\_z$.

In the unit gate line driver circuit, the other of the source and the drain of the transistor $511\_z$ is electrically connected to different gate lines BGL in I gate lines BGL. For example, in the unit gate line driver circuit in a first stage, the other of the source and the drain of a transistor $511\_1$ is connected to gate lines $BGL\_1$ to $BGL\_p$ (p is a natural number of 3 or more and (i-2) or less) in first to p-th rows, and in the unit gate line driver circuit in an s-th stage, the other of the source and the drain of a transistor $511\_s$ is connected to gate lines $BGL\_p(s-1)+1$ to $BGL\_i$ in $(p(s-1)+1)$th to i-th rows.

In the case where the voltage of the gate line BGL to which the transistor is connected is higher than the voltage VC by a certain amount, current flows from the gate line BGL through the source and the drain of the transistor $511\_z$. Thus, the voltage of the gate line BGL is set at voltage which is higher than the voltage VC by the threshold voltage of the transistor $511\_z$. When the voltage of the gate line BGL can be set much lower than the voltage of a source of a selection transistor in a memory cell, the threshold voltage of the selection transistor is shifted positively. Accordingly, the retention characteristics of the memory cell can be improved.

Note that in the case where supply of the voltage VC to the gate line driver circuit is stopped and the voltage of the gate line BGL is lower than the voltage VC, reverse biased voltage is applied to the transistor $511\_z$. Thus, current flowing through the transistor $511\_z$ is only off-state current. Electricity is stored in the capacitor $512\_z$ with this off-state current, and the voltage of the gate line BGL increases over time. Then, the voltage Vgs of the selection transistor in the memory cell decreases; thus, it is impossible to shift the threshold voltage of the transistor. However, since the capacitor $512\_z$ can be provided outside a cell array, larger capacitance can be secured as compared to a storage capacitor in the memory cell. Accordingly, even when the supply of the voltage VC to one of the source and the drain of the transistor $511\_1$ is stopped for a certain period, data written to each memory cell can be retained.

As described with reference to FIG. 14, the example of the gate line driver circuit in this embodiment includes multistage unit gate line driver circuits. The multistage unit gate line driver circuits each include a diode-connected transistor and a capacitor. With such a structure, even when supply of voltage to the gate line driver circuit is temporarily stopped, the voltage of the gate line BGL can be held for a certain period.

Embodiment 5

In this embodiment, a structure example of a semiconductor memory device is described.

Figure 15:
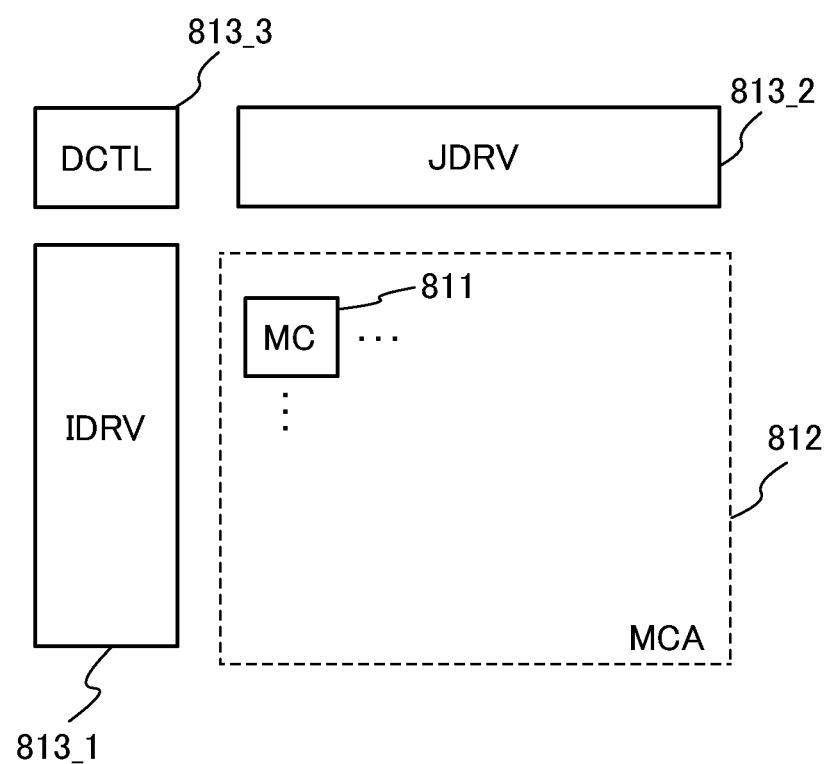
FIG. 15 is a block diagram illustrating a structure example of a semiconductor memory device in Embodiment 5.

First, a structure example of a semiconductor memory device in this embodiment is described with reference to FIG. 15. FIG. 15 is a block diagram illustrating a structure example of the semiconductor memory device in this embodiment.

The semiconductor memory device illustrated in FIG. 15 includes a memory cell array (MCA) 812 including a plurality of memory cells (MC) 811, a first driver circuit (IDRV) 813_1, a second driver circuit (JDRV) 813_2, and a drive control circuit (DCTL) 813_3.

As the structure of the memory cell array, the structure of the memory cell array described in Embodiment 2 can be used.

A row address signal is input to the first driver circuit 813_1. The first driver circuit 813_1 selects the word line WL in accordance with the row address signal input and sets the voltage of the word line WL. The first driver circuit 813_1 includes a decoder, for example. The decoder selects the word line WL in accordance with the row address signal input. Note that the semiconductor memory device in this embodiment may include a plurality of first driver circuits 813_1.

A memory data signal and a column address signal are input to the second driver circuit 813_2. The second driver circuit 813_2 sets the voltage of the bit line BL. Further, the second driver circuit 813_2 sets the voltage of the capacitor line CL in accordance with a read signal and selectively reads data stored in a memory cell 811. The second driver circuit 813_2 includes a decoder, a plurality of analog switches, a read signal output circuit, and a read circuit, for example. The decoder selects the bit line BL. The plurality of analog switches determine whether the memory data signal is output depending on a signal input from the decoder. The read signal output circuit generates and outputs the read signal. The read circuit reads the data stored in the selected memory cell 811 by the read signal.

A write control signal, a read control signal, and an address signal are input to the drive control circuit 813_3. The drive control circuit 813_3 generates and outputs signals which control the operation of the first driver circuit 813_1 and the second driver circuit 813_2 in accordance with the input write control signal, read control signal, and address signal. For example, the drive control circuit 813_3 outputs a plurality of row address signals to the first driver circuit 813_1 and a plurality of column address signals to the second driver circuit 813_2 in accordance with the address signal.

As described with reference to FIG. 15, the example of the memory device in this embodiment includes a memory cell array including a plurality of memory cells, a first driver circuit, a second driver circuit, and a drive control circuit.

With such a structure, data can be written to and read from a predetermined memory cell.

Embodiment 6

In this embodiment, examples of electronic devices each including the semiconductor memory device in the above embodiment are described.

Structure examples of electronic devices in this embodiment are described with reference to FIGS. 16A to 16D.

Figure 16A:
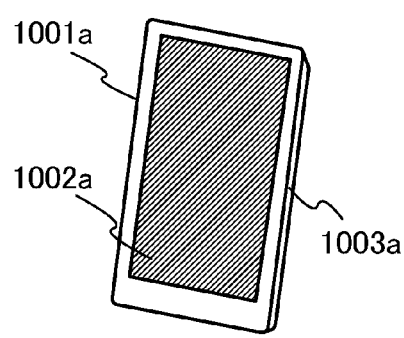
FIGS. 16A to 16D illustrate examples of electronic devices in Embodiment 6.

The electronic device illustrated in FIG. 16A is an example of a personal digital assistant. The personal digital assistant illustrated in FIG. 16A includes a housing 1001*a* and a display portion 1002*a* provided in the housing 1001*a*.

Note that a side surface 1003*a* of the housing 1001*a* may be provided with a connection terminal for connecting the personal digital assistant to an external device and one or more buttons for operating the personal digital assistant illustrated in FIG. 16A.

The personal digital assistant illustrated in FIG. 16A includes a CPU, a memory circuit, an interface for transmitting and receiving a signal between the external device and each of the CPU and the memory circuit, and an antenna for transmitting and receiving a signal to and from the external device, in the housing 1001*a*.

The personal digital assistant illustrated in FIG. 16A serves as one or more of a telephone set, an e-book reader, a personal computer, and a game machine, for example.

Figure 16C:
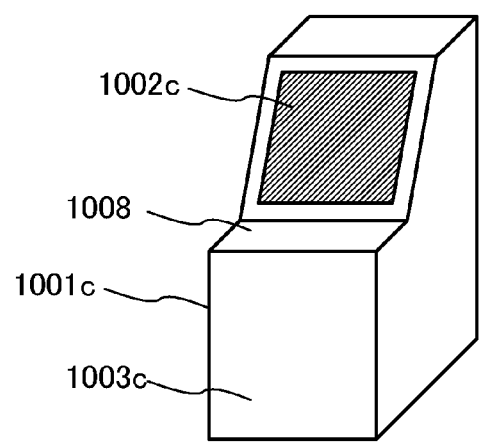
Figure 16B:
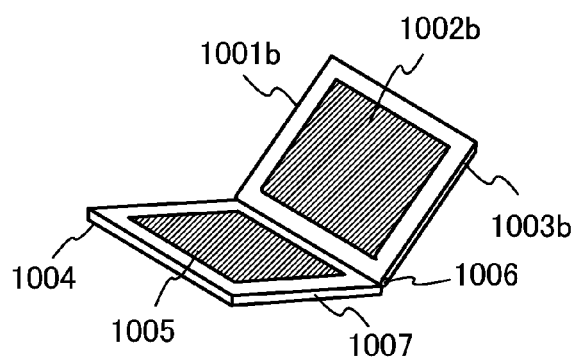

The electronic device illustrated in FIG. 16B is an example of a folding personal digital assistant. The personal digital assistant illustrated in FIG. 16B includes a housing 1001*b*, a display portion 1002*b* provided in the housing 1001*b*, a housing 1004, a display portion 1005 provided in the housing 1004, and a hinge 1006 for connecting the housing 1001*b* and the housing 1004.

In the personal digital assistant illustrated in FIG. 16B, the housing 1001*b* can be stacked on the housing 1004 by moving the housing 1001*b* or the housing 1004 with the hinge 1006.

Note that a side surface 1003*b* of the housing 1001*b* or a side surface 1007 of the housing 1004 may be provided with a connection terminal for connecting the personal digital assistant to an external device and one or more buttons for operating the personal digital assistant illustrated in FIG. 16B.

The display portion 1002*b* and the display portion 1005 may display different images or one image. Note that the display portion 1005 is not necessarily provided, and a keyboard which is an input device may be provided instead of the display portion 1005.

The personal digital assistant illustrated in FIG. 16B includes a CPU, a memory circuit, and an interface for transmitting and receiving a signal between the external device and each of the CPU and the memory circuit in the housing 1001*b* or the housing 1004. Note that the personal digital assistant illustrated in FIG. 16B may includes an antenna for transmitting and receiving a signal to and from the external device.

The personal digital assistant illustrated in FIG. 16B serves as one or more of a telephone set, an e-book reader, a personal computer, and a game machine, for example.

The electronic device illustrated in FIG. 16C is an example of a stationary information terminal. The stationary information terminal illustrated in FIG. 16C includes a housing 1001*c* and a display portion 1002*c* provided in the housing 1001*c*.

Note that the display portion 1002*c* can be provided on a deck portion 1008 in the housing 1001*c*.

The stationary information terminal illustrated in FIG. 16C includes a CPU, a memory circuit, and an interface for transmitting and receiving a signal between the external device and each of the CPU and the memory circuit in the housing 1001*c*. Note that the stationary information terminal illustrated in FIG. 16C may includes an antenna for transmitting and receiving a signal to and from the external device.

Further, a side surface 1003*c* of the housing 1001*c* in the stationary information terminal illustrated in FIG. 16C may be provided with one or more of a ticketing portion that issues a ticket or the like, a coin slot, and a bill slot.

The stationary information terminal illustrated in FIG. 16C serves as an automated teller machine, an information communication terminal (also referred to as a multimedia station) for ordering a ticket or the like, or a game machine, for example.

Figure 16D:
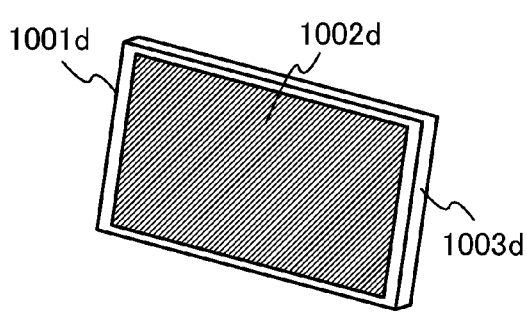

The electronic device illustrated in FIG. 16D is an example of a stationary information terminal. The stationary information terminal illustrated in FIG. 16D includes a housing 1001*d* and a display portion 1002*d* provided in the housing 1001*d*. Note that a support for supporting the housing 1001*d* may also be provided.

Note that a side surface 1003*d* of the housing 1001*d* may be provided with a connection terminal for connecting the stationary information terminal to an external device and one or more buttons for operating the stationary information terminal illustrated in FIG. 16D.

The stationary information terminal illustrated in FIG. 16D includes a CPU, a memory circuit, and an interface for transmitting and receiving a signal between the external device and each of the CPU and the memory circuit in the housing 1001*d*. Note that the stationary information terminal illustrated in FIG. 16D may includes an antenna for transmitting and receiving a signal to and from the external device.

The stationary information terminal illustrated in FIG. 16D serves as a digital photoframe, a monitor, or a television set, for example.

The semiconductor memory device in the above embodiment is used as one memory circuit in an electronic device, for example. For example, the semiconductor memory device in the above embodiment is used as one of the memory circuits in the electronic devices illustrated in FIGS. 16A to 16D.

As described with reference to FIGS. 16A to 16D, the examples of the electronic devices in this embodiment each include a memory circuit which includes the semiconductor memory device in the above embodiments.

With such a structure, even when power is not supplied, data in an electronic device can be retained for a certain period. Thus, reliability can be improved and power consumption can be reduced.

Further, without limitation to the structures illustrated in FIGS. 16A to 16D, a portable semiconductor memory device or the like provided with a connector can be manufactured using the semiconductor memory device in the above embodiment.

REFERENCE NUMERALS

111: transistor, 112: transistor, 130: curve, 131: curve, 150: substrate, 151: insulating layer, 152*a*: semiconductor layer, 152*b*: semiconductor layer, 153: insulating layer, 154: conductive layer, 155: insulating layer, 156: semiconductor layer, 157*a*: conductive layer, 157*b*: conductive layer, 158: insulating layer, 159: conductive layer, 200: memory cell, 211: transistor, 212: transistor, 213: capacitor, 242: semiconductor layer, 242a: semiconductor layer, 242b: semiconductor layer, 250: substrate, 251: insulating layer, 252a: semiconductor layer, 252b: semiconductor layer, 253: insulating layer, 254: conductive layer, 255: insulating layer, 256: semiconductor layer, 257a: conductive layer, 257b: conductive layer, 258: insulating layer, 259a: conductive layer, 259b: conductive layer, 260: insulating layer, 261: conductive layer, 300: memory cell, 301: transistor, 302: transistor, 311: transistor, 312: transistor, 313: capacitor, 342: semiconductor layer, 342a: semiconductor layer, 342b: semiconductor layer, 350: substrate, 351: insulating layer, 352a: semiconductor layer, 352b: semiconductor layer, 353: insulating layer, 354: conductive layer, 355: insulating layer, 356: semiconductor layer, 357a: conductive layer, 357b: conductive layer, 358: insulating layer, 359a: conductive layer, 359b: conductive layer, 360: insulating layer, 361: conductive layer, 511: transistor, 512: capacitor, 811: memory cell, 812: memory cell array, 813: circuit, 1001a: housing, 1001b: housing, 1001c: housing, 1001d: housing, 1002a: display portion, 1002b: display portion, 1002c: display portion, 1002d: display portion, 1003a: side surface, 1003b: side surface, 1003c: side surface, 1003d: side surface, 1004: housing, 1005: display portion, 1006: hinge, 1007: side surface, and 1008: deck portion.

This application is based on Japanese Patent Application serial No. 2010-247996 and Japanese Patent Application serial No. 2010-247995 filed with Japan Patent Office on Nov. 5, 2010, the entire contents of which are hereby incorporated by reference.

The invention claimed is:

1. A semiconductor device comprising a memory circuit, the memory circuit comprising:
a first transistor;
a second transistor;
a first layer serving as a channel formation layer of the second transistor;
a second layer formed using the same material and at the same time as the first layer, wherein the second layer is apart from the first layer and serves as a first gate of the first transistor;
a first insulating layer over the first layer and the second layer;
a first conductive layer overlapping with the first layer with the first insulating layer provided therebetween;
a semiconductor layer overlapping with the second layer with the first insulating layer provided therebetween;
a second conductive layer electrically connected to the semiconductor layer;
a third conductive layer electrically connected to the first conductive layer and the semiconductor layer;
a second insulating layer over the semiconductor layer, the second conductive layer, and the third conductive layer; and
a fourth conductive layer overlapping with the semiconductor layer with the second insulating layer provided therebetween, the fourth conductive layer serving as a second gate of the first transistor,
wherein the first conductive layer is provided between the first insulating layer and the third conductive layer.

2. The semiconductor device according to claim 1, wherein the first layer and the second layer contain silicon and the semiconductor layer is an oxide semiconductor layer.

3. The semiconductor device according to claim 1, wherein the second layer contains an impurity element imparting conductivity.

4. The semiconductor device according to claim 3, wherein the first layer includes a pair of impurity regions containing the impurity element.

5. The semiconductor device according to claim 1, wherein the semiconductor layer is formed using a material different from the material of the first layer, and wherein the semiconductor layer serves as a channel formation layer of the first transistor.

6. The semiconductor device according to claim 1, wherein the third conductive layer is in contact with the first conductive layer.

7. The semiconductor device according to claim 1, wherein the memory circuit further comprises a third insulating layer over the second insulating layer and the fourth conductive layer, and a fifth conductive layer over the third insulating layer,
wherein the fifth conductive layer is electrically connected to the first layer through a first opening penetrating the first to third insulating layers, and is electrically connected to the third conductive layer through a second opening penetrating the second and third insulating layers.

8. A semiconductor device comprising:
a plurality of memory cells arranged in I rows (I is a natural number of 2 or more) and J columns (J is a natural number), each the plurality of memory cells comprising:
a first transistor;
a second transistor;
a first layer serving as a channel formation layer of the second transistor;
a second layer formed using the same material and at the same time as the first layer, wherein the second layer is apart from the first layer and serves as a first gate of the first transistor;
a first insulating layer over the first layer and the second layer;
a first conductive layer overlapping with the first layer with the first insulating layer provided therebetween;
a semiconductor layer overlapping with the second layer with the first insulating layer provided therebetween;
a second conductive layer electrically connected to the semiconductor layer;
a third conductive layer electrically connected to the first conductive layer and the semiconductor layer;
a second insulating layer over the semiconductor layer, the second conductive layer, and the third conductive layer; and
a fourth conductive layer overlapping with the semiconductor layer with the second insulating layer provided therebetween, the fourth conductive layer serving as a second gate of the first transistor,
wherein the first conductive layer is provided between the first insulating layer and the third conductive layer.

9. The semiconductor device according to claim 8, wherein the first layer and the second layer contain silicon and the semiconductor layer is an oxide semiconductor layer.

10. The semiconductor device according to claim 8, wherein the second layer contains an impurity element imparting conductivity.

11. The semiconductor device according to claim 10, wherein the first layer includes a pair of impurity regions containing the impurity element.

12. The semiconductor device according to claim 8, wherein the semiconductor layer is formed using a material different from the material of the first layer, and wherein the semiconductor layer serves as a channel formation layer of the first transistor.

13. The semiconductor device according to claim 8, wherein the third conductive layer is in contact with the first conductive layer.

14. The semiconductor device according to claim 8, wherein each the plurality of memory cells further comprises a third insulating layer over the second insulating layer and the fourth conductive layer, and a fifth conductive layer over the third insulating layer,
  wherein the fifth conductive layer is electrically connected to the first layer through a first opening penetrating the first to third insulating layers, and is electrically connected to the third conductive layer through a second opening penetrating the second and third insulating layers.

15. A semiconductor device comprising:
  a plurality of memory cells arranged in I rows (I is a natural number of 2 or more) and J columns (J is a natural number), each the plurality of memory cells comprising:
    a first transistor;
    a second transistor;
    a first layer serving as a channel formation layer of the second transistor;
    a second layer formed using the same material and at the same time as the first layer, wherein the second layer is apart from the first layer and serves as a first gate of the first transistor;
    a first insulating layer over the first layer and the second layer;
    a first conductive layer overlapping with the first layer with the first insulating layer provided therebetween;
    a semiconductor layer overlapping with the second layer with the first insulating layer provided therebetween;
    a second conductive layer electrically connected to the semiconductor layer;
    a third conductive layer electrically connected to the first conductive layer and the semiconductor layer;
    a second insulating layer over the semiconductor layer, the second conductive layer, and the third conductive layer; and
    a fourth conductive layer overlapping with the semiconductor layer with the second insulating layer provided therebetween, the fourth conductive layer serving as a second gate of the first transistor,
  wherein the first insulating layer serves as a gate insulating layer of the second transistor in each the plurality of memory cells, and
  wherein the first conductive layer is provided between the first insulating layer and the third conductive layer.

16. The semiconductor device according to claim 15, wherein the first layer and the second layer contain silicon and the semiconductor layer is an oxide semiconductor layer.

17. The semiconductor device according to claim 15, wherein in the memory cells arranged in the same column, the second conductive layer of a first memory cell in a k-th row (k is a natural number of 2 or more and I or less) is electrically connected to the semiconductor layer of a second memory cell in a (k−1)th row.

18. The semiconductor device according to claim 15, wherein the second layer contains an impurity element imparting conductivity.

19. The semiconductor device according to claim 18, wherein the first layer includes a pair of impurity regions containing the impurity element.

20. The semiconductor device according to claim 15, wherein the semiconductor layer is formed using a material different from the material of the first layer, and wherein the semiconductor layer serves as a channel formation layer of the first transistor.

21. The semiconductor device according to claim 15, wherein the third conductive layer is in contact with the first conductive layer.

* * * * *